(12) United States Patent
Xu et al.

(10) Patent No.: US 12,571,858 B2
(45) Date of Patent: Mar. 10, 2026

(54) ALL-IN-ONE SENSING APPARATUS FOR TRANSFORMER BUSHING TAP MONITORING

(71) Applicant: STATE GRID XINJIANG CO., LTD. ELECTRIC POWER RESEARCH INSTITUTE, Urumqi (CN)

(72) Inventors: Guanghu Xu, Urumqi (CN); Dingqian Yang, Urumqi (CN); Dandong He, Urumqi (CN); Xiaoguang Li, Urumqi (CN); Duohu Gong, Urumqi (CN); Shan Li, Urumqi (CN); Yunkai Yue, Urumqi (CN); Yuxuan Feng, Urumqi (CN); Qingchuan Zhang, Urumqi (CN); Yuan Zhang, Urumqi (CN); Yadi Xie, Urumqi (CN)

(73) Assignee: STATE GRID XINJIANG CO., LTD. ELECTRIC POWER RESEARCH INSTITUTE, Urumqi (CN)

( * ) Notice: Subject to any disclaimer, the term of this patent is extended or adjusted under 35 U.S.C. 154(b) by 135 days.

(21) Appl. No.: 18/583,905

(22) Filed: Feb. 22, 2024

(65) Prior Publication Data

US 2024/0192288 A1     Jun. 13, 2024

Related U.S. Application Data

(63) Continuation-in-part of application No. PCT/CN2023/092625, filed on May 7, 2023.

(30) Foreign Application Priority Data

May 7, 2022    (CN) .......................... 202210491294.7

(51) Int. Cl.
*G01R 31/62*          (2020.01)

(52) U.S. Cl.
CPC .................................... *G01R 31/62* (2020.01)

(58) Field of Classification Search
CPC ..... G01R 31/62; G01R 31/1263; G01K 13/00
See application file for complete search history.

(56) References Cited

U.S. PATENT DOCUMENTS 6,466,034 B1 * 10/2002 Wang ....................... G01H 1/00
                                                                361/38
2003/0038016 A1 * 2/2003 Hilal ...................... G01R 1/206
                                                                200/1 R (Continued)

FOREIGN PATENT DOCUMENTS

CN          1484034 A   *   3/2004
CN      111999685 A      11/2020

(Continued)

OTHER PUBLICATIONS

English translation of CN-1484034-A. (Year: 2004).*
International search report of PCT Patent Application No. PCT/CN2023/092625 issued on Sep. 8, 2023.

*Primary Examiner* — Huy Q Phan
*Assistant Examiner* — Haidong Zhang

(57)          ABSTRACT

An all-in-one sensing apparatus for transformer bushing tap monitoring includes: a tap lead device connected to a grounding wire of a transformer bushing through a mounting bracket and configured to lead out the grounding wire; a sensor assembly provided on the mounting bracket, connected to an oil taking port of the bushing, and configured to detect a temperature, a pressure, a partial discharge current and a hydrogen content of the bushing and upload the temperature, the pressure, the partial discharge current and the hydrogen content of the bushing; and a power module provided on the mounting bracket, and configured to supply power to the sensor assembly through coil induction, where an output terminal of the tap lead device is connected (Continued)

to the power module, and an output terminal of the power module is connected to the sensor assembly.

8 Claims, 32 Drawing Sheets

(56)                        References Cited

U.S. PATENT DOCUMENTS

| | | | | |
|---|---|---|---|---|
| 2011/0031980 | A1* | 2/2011 | Kruger .................. | G01R 31/62 |
| | | | | 324/547 |
| 2014/0125351 | A1* | 5/2014 | Woodward, Jr. .......... | H02J 3/00 |
| | | | | 324/537 |
| 2016/0327600 | A1* | 11/2016 | Pamulaparthy .......... | H02H 7/04 |
| 2017/0288572 | A1* | 10/2017 | Kim ........................ | H01F 27/04 |

FOREIGN PATENT DOCUMENTS

| | | | |
|---|---|---|---|
| CN | 212158678 | U | 12/2020 |
| CN | 114173299 | A | 3/2022 |
| CN | 216117869 | U | 3/2022 |

* cited by examiner

A-A

107

111

101

104

105

103

106

102

Dielectric loss testing sensor interface

ALL-IN-ONE SENSING APPARATUS FOR TRANSFORMER BUSHING TAP MONITORING

CROSS REFERENCE TO RELATED APPLICATIONS

The present application is a Continuation-In-Part Application of PCT Application No. PCT/CN2023/092625 filed on May 7, 2023, which claims the benefit of Chinese Patent Application No. 202210491294.7 filed on May 7, 2022. All the above are hereby incorporated by reference in their entirety.

TECHNICAL FIELD

The present disclosure relates to the technical field of transformer substation monitoring, and in particular to an all-in-one sensing apparatus for transformer bushing tap monitoring.

BACKGROUND

For a main transformer at 110 kV and above, a wire is mainly led out with a capacitive bushing. A bushing tap is considered as an important signal pickup position to detect a partial discharge parameter, a dielectric loss parameter and so on of the main transformer.

With steady advancement of grid construction, Xinjiang power grid is imposing increasingly high requirements on transparency of ultra high voltage (UHV) electrical devices, and there are more and more online monitoring apparatuses with a low power consumption, a small size and a wireless Internet of things (IoT) function.

A wired transmission type current transformation sensor used by an oil impregnated paper (OIP) insulated bushing is provided with many ports to cause a low safety and a low reliability. In an operating state of the main transformer, a bushing tap protective cover cannot be opened. To pick up a partial discharge signal and a dielectric loss signal in the operating state, a bushing tap grounding wire is led to the ground. This changes a grounding mode to some extent, and poses a risk to safe operation.

As an improvement to the above technology, a tap lead device is provided. Without changing original electrical characteristics of the bushing tap, it extracts the partial discharge signal and the grounding current signal of the bushing tap. However, due to wired transmission, the existing tap lead device has a complex mounting structure, a low safety and a low reliability. The device is externally powered or charged, and does not facilitate mounting and maintenance. Moreover, with wired connection, the existing tap lead device involves huge wiring to lower a working efficiency.

SUMMARY

The present disclosure provides an all-in-one sensing apparatus for transformer bushing tap monitoring, to overcome the problems in the prior art.

The technical solutions of the present disclosure are as follows:

The present disclosure provides an all-in-one sensing apparatus for transformer bushing tap monitoring, including:

a tap lead device connected to a grounding wire of a transformer bushing through a mounting bracket and configured to lead out the grounding wire, so as to detect a current and voltage signal of the grounding wire;

a sensor assembly provided on the mounting bracket, connected to an oil taking port of the transformer bushing, and configured to detect a temperature, a pressure, a partial discharge current and a hydrogen content of the transformer bushing and upload the temperature, the pressure, the partial discharge current and the hydrogen content of the transformer bushing; and a power module provided on the mounting bracket, and configured to supply power to the sensor assembly through coil induction, where an output terminal of the tap lead device is connected to the power module, and an output terminal of the power module is connected to the sensor assembly.

As a further technical solution of the present disclosure, the sensor assembly includes:

a base, a mounting housing, and a cover body, where the mounting housing is provided on the base; the cover body covers the mounting housing; the base is connected to the bushing through the mounting bracket with a flange plate; and a high-frequency head, a pressure sensor, a temperature sensor and a hydrogen sensor are provided in the base;

a first circuit board and a second circuit board are provided in the mounting housing;

an exhaust vent and an oil taking port are formed at a side of the base;

an antenna is provided at a side of the mounting housing; and the antenna is connected to the second circuit board;

a first wiring port and a second wiring port are further formed at the side of the mounting housing;

the first wiring port is connected to the first circuit board, and the second wiring port is connected to the second circuit board; and the high-frequency head, the pressure sensor, the temperature sensor and the hydrogen sensor each include an output terminal connected to the second circuit board; and an output terminal of the first circuit board is connected to the high-frequency head, the pressure sensor, the temperature sensor and the hydrogen sensor.

As a further technical solution of the present disclosure, the power module includes a housing; a rechargeable battery, a power control module, a power supply coil and a detection coil are provided in the housing; an output terminal of the detection coil is connected to the first circuit board through the first wiring port; an output terminal of the power supply coil is connected to the power control module; the power control module is connected to the rechargeable battery; and an output terminal of the power control module is connected to the second circuit board through the second wiring port.

As a further technical solution of the present disclosure, the tap lead device includes a tap housing and a rear cover connected to the tap housing; an insulating sleeve is provided in the tap housing; a compression ring and a pressure spring are provided in the insulating sleeve; a conductive post is provided in the pressure spring; and a wire outgoing hole is formed in the rear cover.

Further, a junction between the tap housing and the transformer bushing is provided with a sealing groove; and a sealing ring is provided in the sealing groove.

As a further technical solution of the present disclosure, the mounting bracket includes a bottom plate, a bushing mounting plate, and a support plate; the bottom plate and the bushing mounting plate are parallel to each other and are connected through a connecting plate; the support plate is further provided between the bottom plate and the bushing mounting plate; a wire hole is formed in the support plate; a bushing tap grounding wire hole and an oil taking port are formed in the connecting plate; the sensor assembly is provided at the oil taking port of the connecting plate; the tap lead device is provided at the bushing tap grounding wire hole; and the sensor assembly, the tap lead device and the power module are connected to the mounting bracket.

As a further technical solution of the present disclosure, the second circuit board includes:

a power conversion module, a signal acquisition module, a control module, and a wireless transmission module, where an output terminal of the power conversion module is connected to the signal acquisition module and the control module; an output terminal of the signal acquisition module is connected to the control module; and the control module is connected to the wireless transmission module;

the signal acquisition module includes a high frequency current transformer (HFCT) acquisition circuit, an ultra high frequency (UHF) acquisition circuit, a single hydrogen signal acquisition circuit, a dielectric loss signal acquisition circuit, and a pressure-temperature acquisition circuit;

the HFCT acquisition circuit is configured to acquire an output signal of a coaxial radio-frequency (RF) cable in the transformer bushing, perform multistage amplification on an acquired output signal and transmit a processed signal to the control module;

the UHF acquisition circuit is configured to acquire the output signal of the coaxial RF cable in the transformer bushing, input the acquired output signal to an inductor-capacitor (LC) filter circuit and an amplifier circuit to obtain a UHF acquisition signal and transmit the UHF acquisition signal to the control module;

the single hydrogen signal acquisition circuit is configured to amplify a signal detected by the hydrogen sensor, and output an amplified signal to the control module;

the dielectric loss signal acquisition circuit is configured to compare a signal obtained by signal acquisition of the dielectric loss sensor from a lead-out grounding wire with a preset reference voltage to obtain a dielectric loss signal, and transmit the dielectric loss signal to the control module; and the pressure-temperature acquisition circuit is configured to transmit a temperature signal and a pressure signal of the transformer bushing respectively detected by the temperature sensor and the pressure sensor to the control module.

As a further technical solution of the present disclosure, the control module is an STM32L471-type microprocessor control unit (MCU). The STM32L471-type MCU is an ultra-low-power 80-Mhz Arm Cortex-M4 MCU having a floating-point unit (FPU), and is provided with a 512-KB Flash memory and a digital filter for sigma-delta modulators (DFSDM).

As a further technical solution of the present disclosure, the temperature sensor is a Ntc10d-11-type thermistor, and the pressure sensor is a Rv1-10d561k-type varistor.

As a further technical solution of the present disclosure, the antenna is an SX1268-type long-range (LORA) antenna with a transmission frequency of 470-510 MHz.

The present disclosure has the following beneficial effects:

1. According to the present disclosure, the all-in-one sensing apparatus composed of the sensor assembly, the tap lead device and the power module acquires a pressure, a temperature, a hydrogen content, a dielectric loss, a UHF signal, and an HFCT signal of the transformer bushing. The power module supplies power through coil induction. With the tap lead device, the tap grounding wire is led out and connected to the power module for detection and power supply. The power module provides a voltage and a current required by the sensor assembly. The sensor assembly monitors the transformer bushing and wirelessly transmits information to a background monitoring center, thereby realizing remote monitoring.

2. The mounting housing is connected to the mounting bracket through the base with the flange plate, so firm and reliable connection is achieved. The first circuit board is a signal acquisition module. The second circuit board is a control module. A signal acquisition cable at the output terminal of the power module is connected to the first circuit board through the first wiring port. A power cable at the output terminal of the power module is connected to the sensor assembly through the second wiring port. The transmission antenna at the side of the mounting housing realizes wireless transmission, and is mounted conveniently. There is no need to additionally provide a transmission cable, thereby simplifying the structure. The sensor assembly is provided at the oil taking port of the transformer bushing. The sensor assembly combines with the temperature sensor, the pressure sensor, the high-frequency head and the hydrogen sensor, and is mounted and detected conveniently.

3. The power module realizes self-induction power supply through the power supply coil. Without additionally providing a power source or replacing the battery, the all-in-one sensing apparatus can be used for a long term with a less maintenance frequency and a longer service life.

4. With the sealing groove and the sealing ring, a tight connection between the tap housing and the transformer bushing is achieved.

5. The mounting bracket can use different design structures according to a bushing structure, and can fix and support the sensor assembly, the power module and the tap lead device.

REFERENCE NUMERALS

Figure 1:
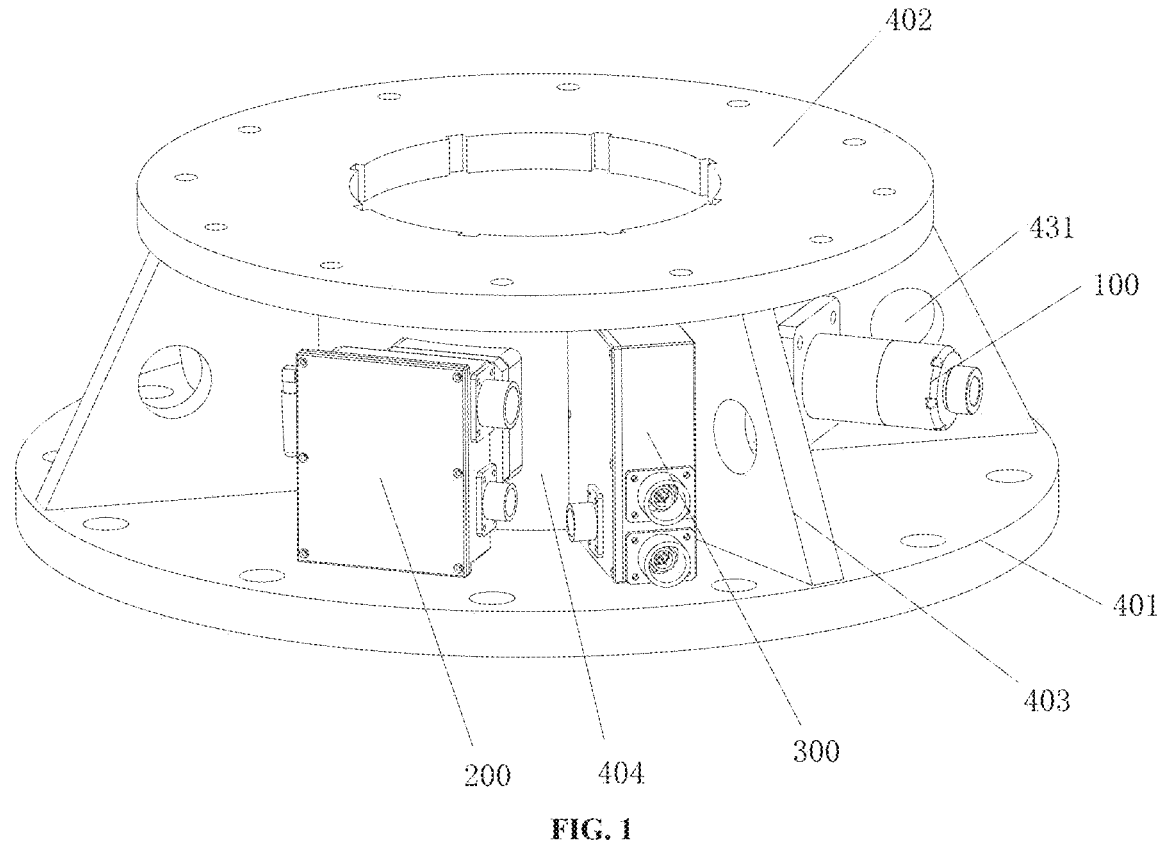
FIG. 1 is a structural view of an all-in-one sensing apparatus for transformer bushing tap monitoring according to the present disclosure.
Figure 2:
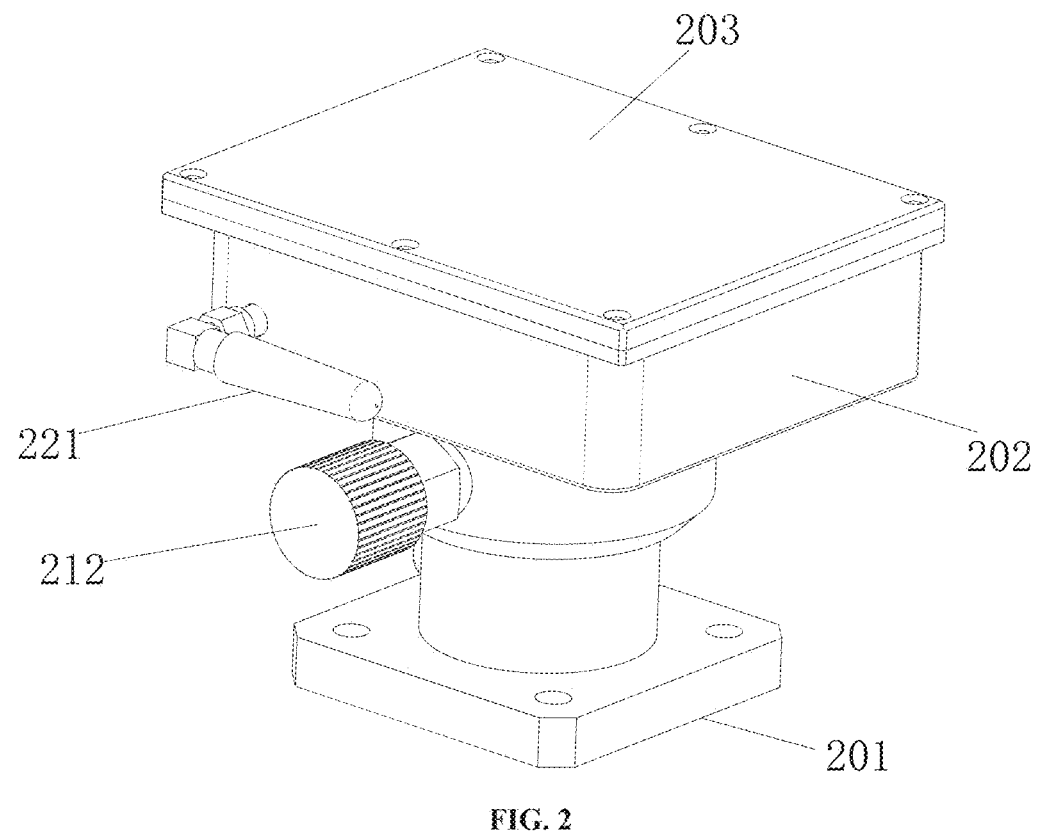
FIG. 2 is a perspective structural view of a sensor assembly according to the present disclosure.
Figure 3:
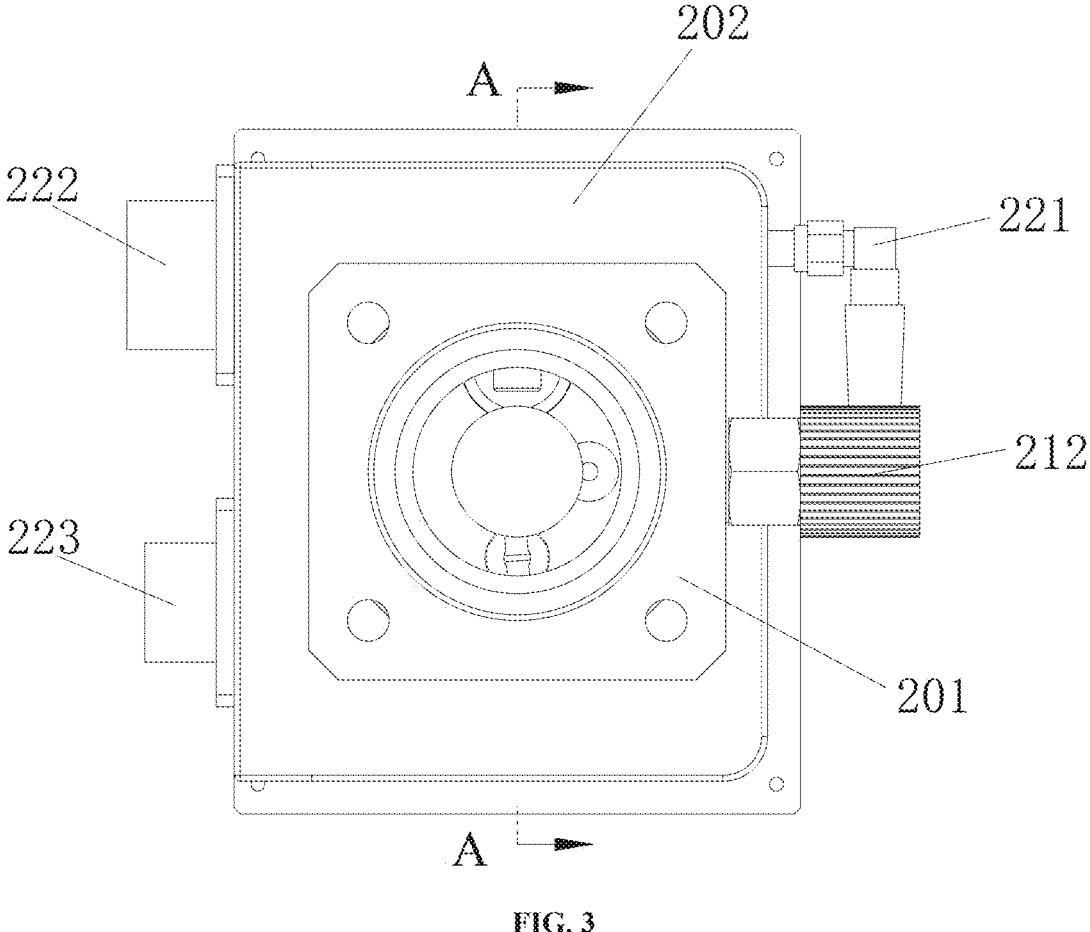
FIG. 3 is a front view of a sensor assembly according to the present disclosure.
Figure 4:
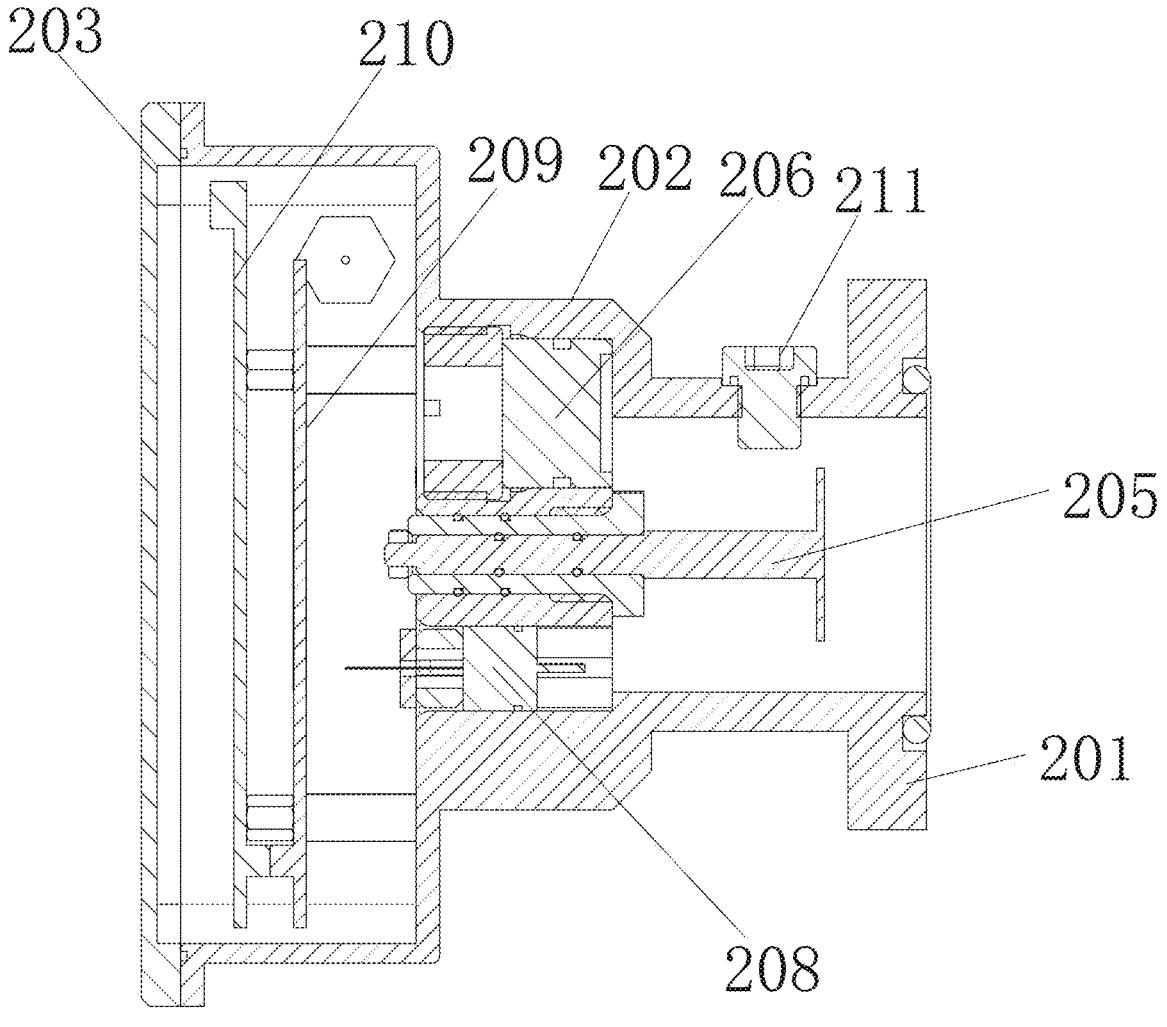
FIG. 4 is a sectional view along A-A of a sensor assembly according to the present disclosure.
Figure 5:
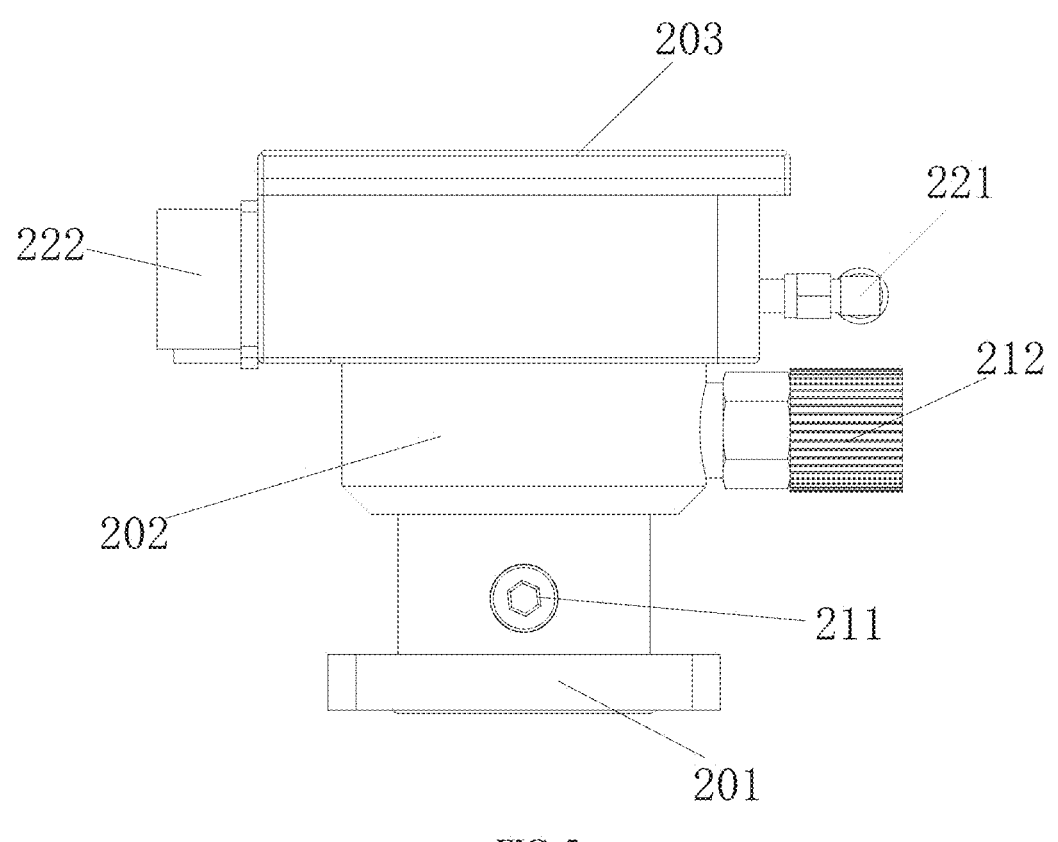
FIG. 5 is a top view of a sensor assembly according to the present disclosure.

100—tap lead device, 200—sensor assembly, and 300—power module;

101—tap housing, 102—rear cover, 103—insulating sleeve, 104—compression ring, 105—pressure spring, 106—conductive post, and 107—sealing ring;

111—sealing groove, and 121—wire outgoing hole;

201—base, 202—mounting housing, 203—cover body, 205—high-frequency head, 206—pressure sensor, 208—hydrogen sensor, 209—first circuit board, 210—second circuit board, 211—exhaust vent, and 212—oil taking port;

2101—power conversion module, 2102—signal acquisition module, 2103—control module, and 2104—wireless transmission module;

2121—HFCT acquisition circuit, 2122—UHF acquisition circuit, 2123—single hydrogen signal acquisition circuit, 2124—dielectric loss signal acquisition circuit, and 2125—pressure-temperature acquisition circuit;

221—antenna, 222—first wiring port, and 223—second wiring port;

301—housing, 302—rechargeable battery, 303—power control module, 304—power supply coil, and 305—detection coil; and

401—bottom plate, 402—bushing mounting plate, 403—support plate, 404—connecting plate, and 431—wire hole.

DETAILED DESCRIPTION

In order to make the objectives, features, and effects of the present disclosure fully understood, the concepts, specific structures, and technical effects of the present disclosure will be clearly and completely described below in conjunction with the embodiments and accompanying drawings. Apparently, the described embodiments are merely some rather than all of the embodiments of the present disclosure. All other embodiments obtained by those skilled in the art based on the embodiments of the present disclosure without creative efforts should fall within the protection scope of the present disclosure.

As shown in FIG. 1 to FIG. 11, an all-in-one sensing apparatus for transformer bushing tap monitoring includes:

a tap lead device 100 connected to a grounding wire of a transformer bushing through a mounting bracket and configured to lead out the grounding wire, so as to detect a current and voltage signal of the grounding wire;

a sensor assembly 200 provided on the mounting bracket, connected to an oil taking port of the transformer bushing, and configured to detect a temperature, a pressure, a partial discharge current and a hydrogen content of the transformer bushing and upload the temperature, the pressure, the partial discharge current and the hydrogen content of the transformer bushing; and a power module 300 provided on the mounting bracket, and configured to supply power to the sensor assembly 200 through coil induction.

An output terminal of the tap lead device 100 is connected to the power module 300. An output terminal of the power module 300 is connected to the sensor assembly 200.

In the embodiment of the present disclosure, the all-in-one sensing apparatus composed of the sensor assembly, the tap lead device and the power module acquires a pressure, a temperature, a hydrogen content, a dielectric loss, a UHF signal, and an HFCT signal of the transformer bushing. The power module supplies power through coil induction. With the tap lead device, the grounding wire of the transformer bushing, namely the bushing tap grounding wire, is led out and connected to the power module for detection and power supply. The power module provides a voltage and a current required by the sensor assembly. The sensor assembly monitors the transformer bushing and wirelessly transmits information to a background monitoring center, thereby realizing remote monitoring.

In the embodiment of the present disclosure, as shown in FIG. 2 to FIG. 5, the sensor assembly 200 includes:

a base 201, a mounting housing 202, and a cover body 203. The mounting housing is provided on the base. The cover body covers the mounting housing. The base 201 is connected to the transformer bushing through the mounting bracket with a flange plate. A high-frequency head 205, a pressure sensor 206, a temperature sensor and a hydrogen sensor 208 are provided in the base 201. Specifically, the high-frequency head 205 is a low-noise frequency demultiplier.

A first circuit board 209 and a second circuit board 210 are provided in the mounting housing 202.

An exhaust vent 211 and an oil taking port 212 are formed at a side of the base 201.

An antenna 221 is provided at a side of the mounting housing 202. The antenna 221 is connected to the second circuit board 210.

A first wiring port 222 and a second wiring port 223 are further formed at the side of the mounting housing 202.

A wiring terminal in the first wiring port 222 is connected to the first circuit board 209. A wiring terminal in the second wiring port 223 is connected to the second circuit board 210.

The high-frequency head 205, the pressure sensor 206, the temperature sensor and the hydrogen sensor 208 each include an output terminal connected to the second circuit board 210. An output terminal of the first circuit board 209 is connected to the high-frequency head 205, the pressure sensor 206, the temperature sensor and the hydrogen sensor 208.

In the embodiment of the present disclosure, the mounting housing is connected to the mounting bracket through the base with the flange plate, so firm and reliable connection is achieved. The first circuit board is a signal acquisition module. The second circuit board is a control module. A signal acquisition cable at the output terminal of the power module is connected to the first circuit board through the first wiring port. A power cable at the output terminal of the power module is connected to the sensor assembly through the second wiring port. The transmission antenna at the side of the mounting housing realizes wireless transmission, and is mounted conveniently. There is no need to additionally provide a transmission cable, thereby simplifying the structure. The sensor assembly is provided at the oil taking port of the transformer bushing. The sensor assembly combines with the temperature sensor, the pressure sensor, the high-frequency head and the hydrogen sensor, and is mounted and detected conveniently.

Figure 9:
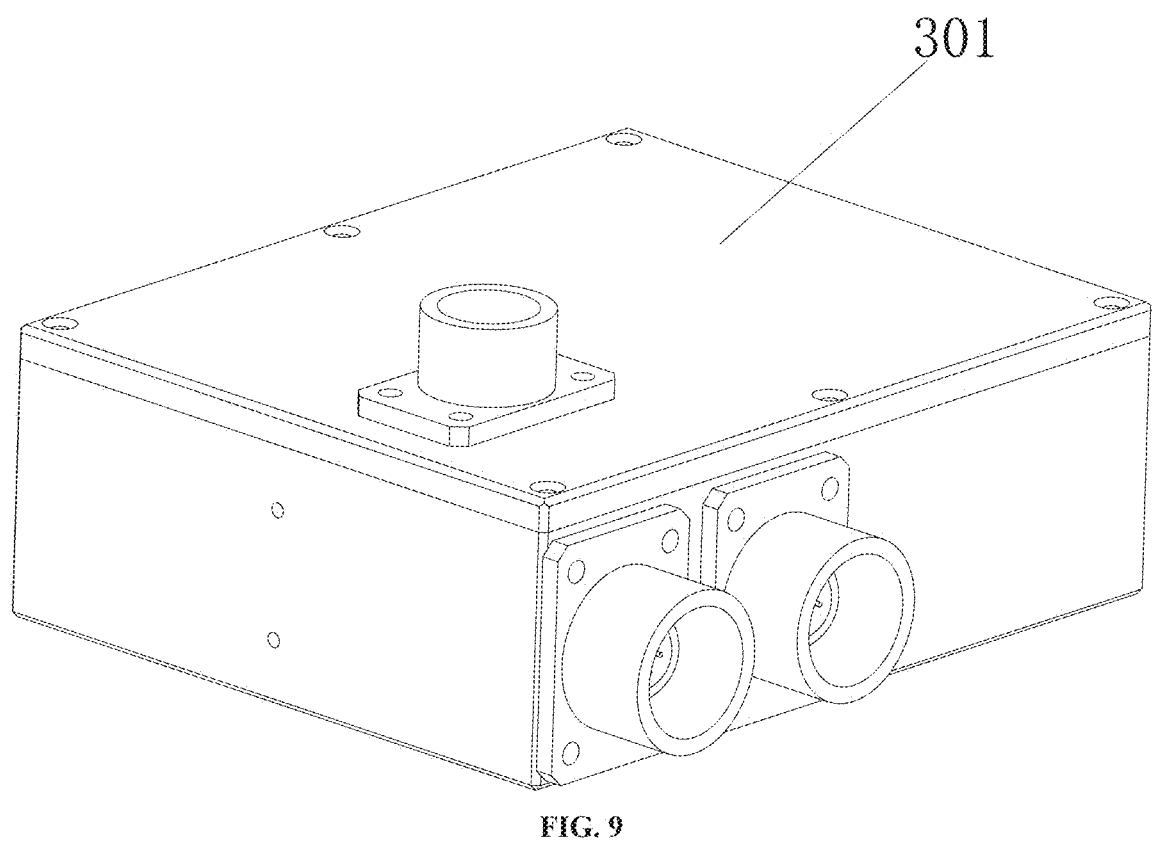
FIG. 9 is a structural view of a power module according to the present disclosure.
Figure 10:
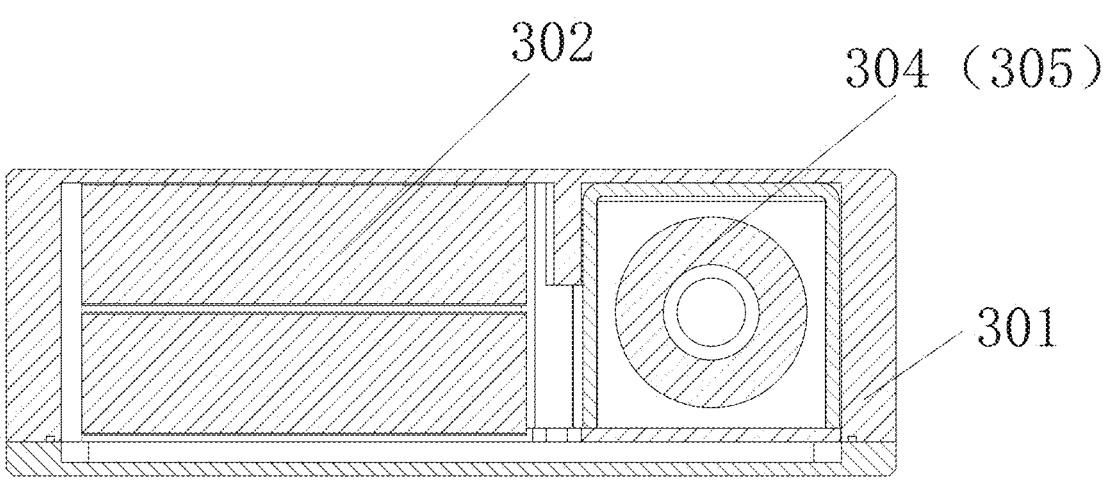
FIG. 10 is a sectional view of a power module according to the present disclosure.
Figure 11:
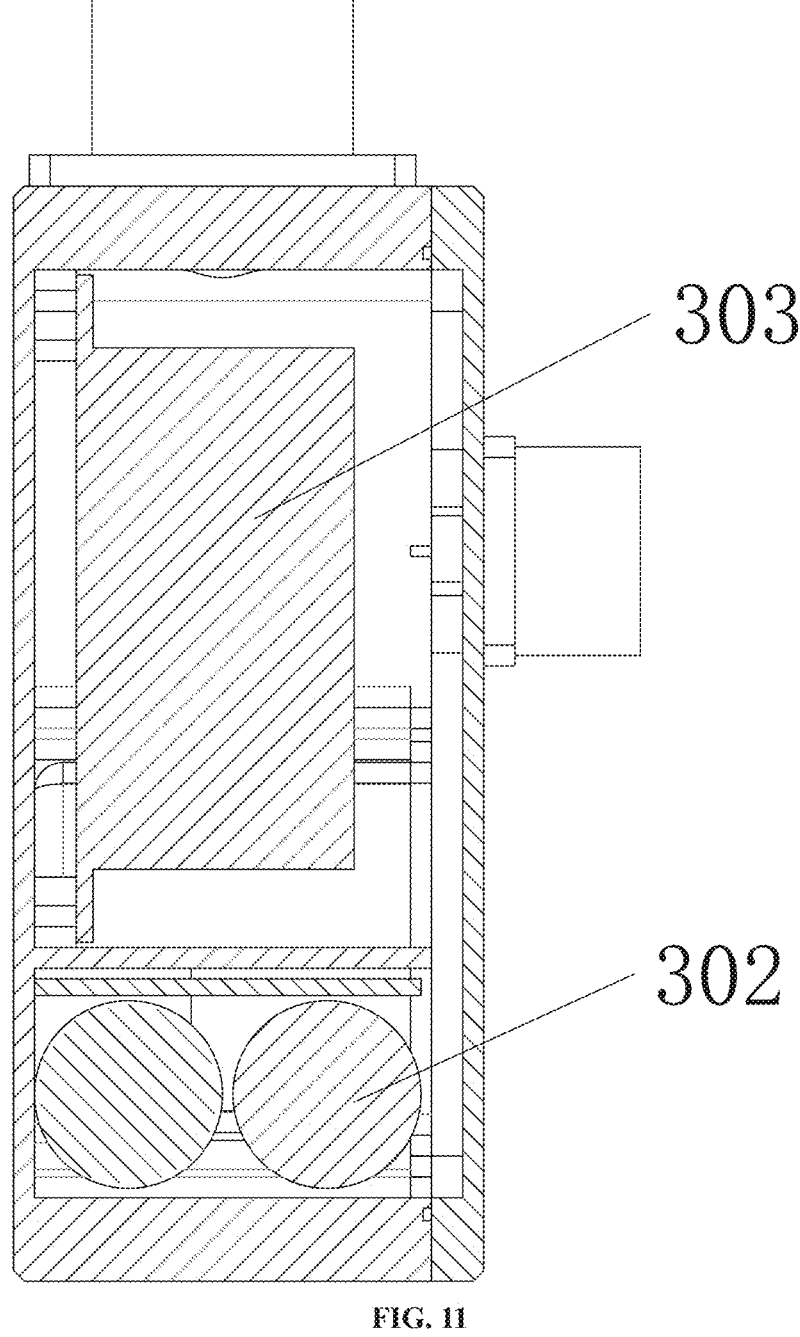
FIG. 11 is another sectional view of a power module according to the present disclosure.

In the embodiment of the present disclosure, as shown in FIG. 9 to FIG. 11, the power module 300 includes a housing 301. A rechargeable battery 302, a power control module 303, a power supply coil 304 and a detection coil 305 are provided in the housing 301. An output terminal of the detection coil 305 is connected to the first circuit board 209 through the first wiring port. An output terminal of the power supply coil 304 is connected to the power control module 303. The power control module 303 is connected to the rechargeable battery 302. An output terminal of the power control module 303 is connected to the second circuit board 210 through the second wiring port.

The power module realizes self-induction power supply through the power supply coil. Without additionally providing a power source or replacing the battery, the all-in-one sensing apparatus can be used for a long term with a less maintenance frequency and a longer service life.

Figure 6:
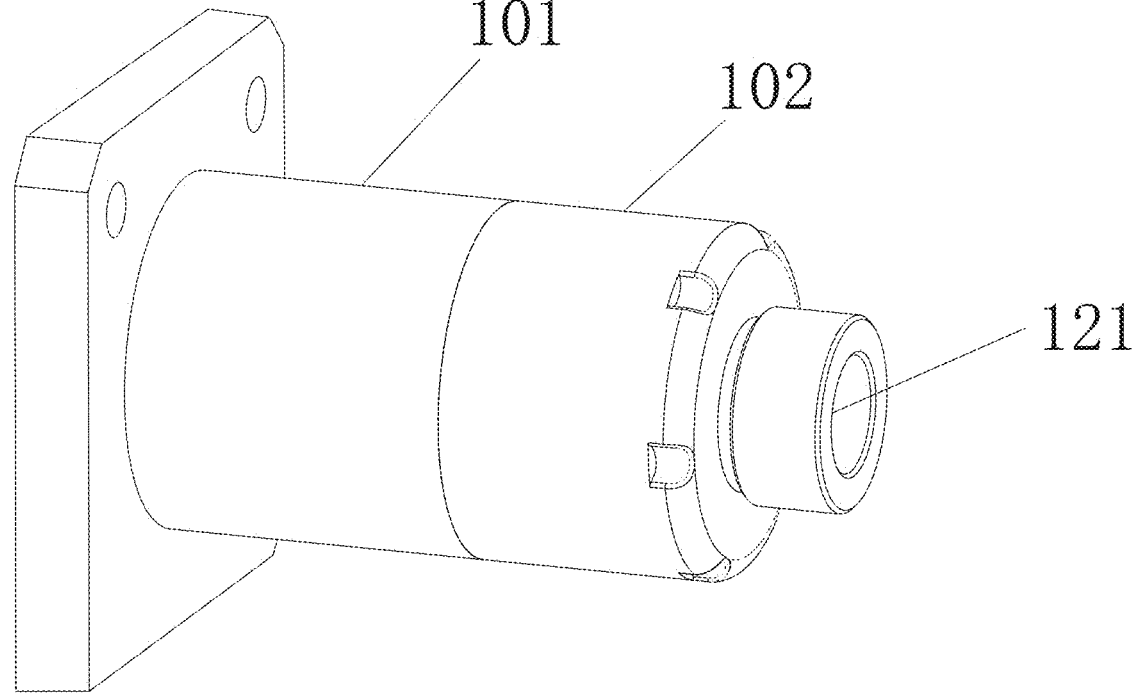
FIG. 6 is a perspective structural view of a tap lead device according to the present disclosure.
Figure 7:
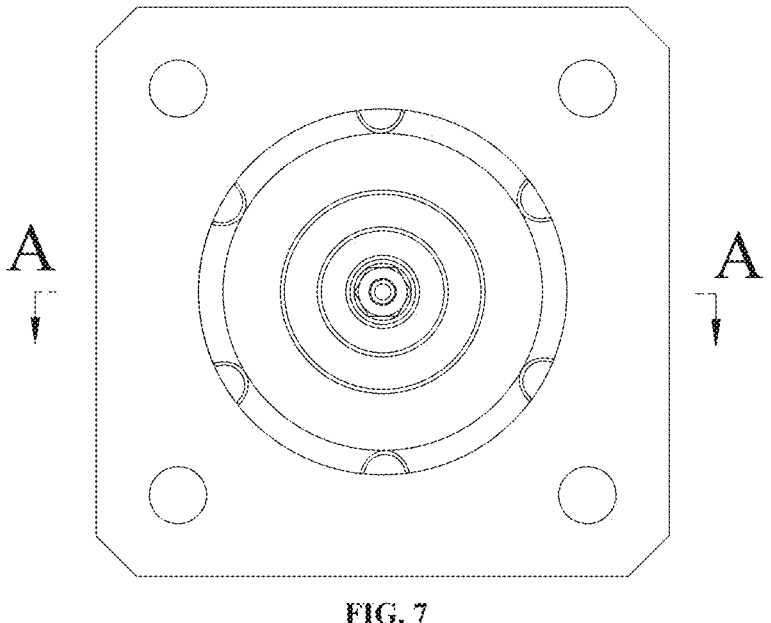
FIG. 7 is a front view of a tap lead device according to the present disclosure.
Figure 8:
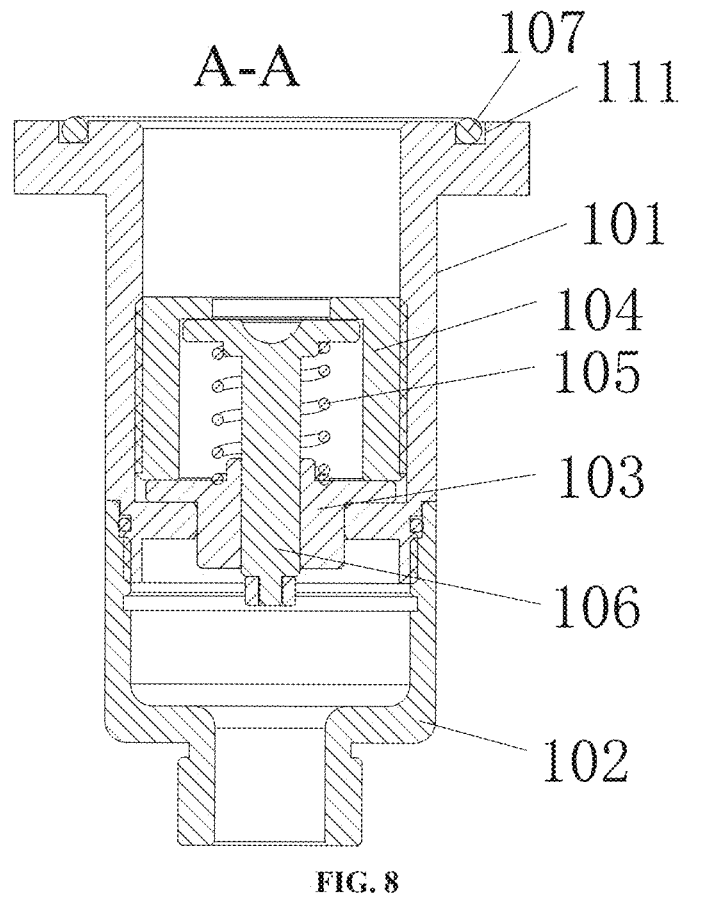
FIG. 8 is a sectional view along A-A of a tap lead device according to the present disclosure.

In the embodiment of the present disclosure, as shown in FIG. 6 to FIG. 8, the tap lead device 100 includes a tap housing 101 and a rear cover 102 connected to the tap housing 101. An insulating sleeve 103 is provided in the tap housing 101. A compression ring 104 and a pressure spring 105 are provided in the insulating sleeve 103. A conductive post 106 is provided in the pressure spring 105. A wire outgoing hole 121 is formed in the rear cover 102.

A sealing ring 107 is provided between the tap housing 101 and the bushing. A mounting junction between the tap housing 101 and the transformer bushing is provided with a sealing groove 111. The sealing ring 107 is provided in the sealing groove 111. With the sealing groove and the sealing ring, a tight connection between the tap housing and the bushing is achieved.

In the embodiment of the present disclosure, the mounting bracket includes a bottom plate 401, a bushing mounting plate 402, and a support plate 403. The bottom plate 401 and the bushing mounting plate 402 are parallel to each other and are connected through a connecting plate 404. The support plate 403 is further provided between the bottom plate 401 and the bushing mounting plate 402. A wire hole 431 is formed in the support plate 403. A bushing tap grounding wire hole and an oil taking port are formed in the connecting plate 404. The sensor assembly is connected to the oil taking port of the transformer bushing through the oil taking port of the connecting plate. The tap lead device is provided at the bushing tap grounding wire hole. The sensor assembly, the tap lead device and the power module are connected to the mounting bracket.

In the embodiment of the present disclosure, the mounting bracket can use different design structures according to a bushing structure. The mounting bracket depends on mounting of the sensor assembly, the power module and the tap lead device, and fixes and supports the sensor assembly, the power module and the tap lead device.

Figure 12:
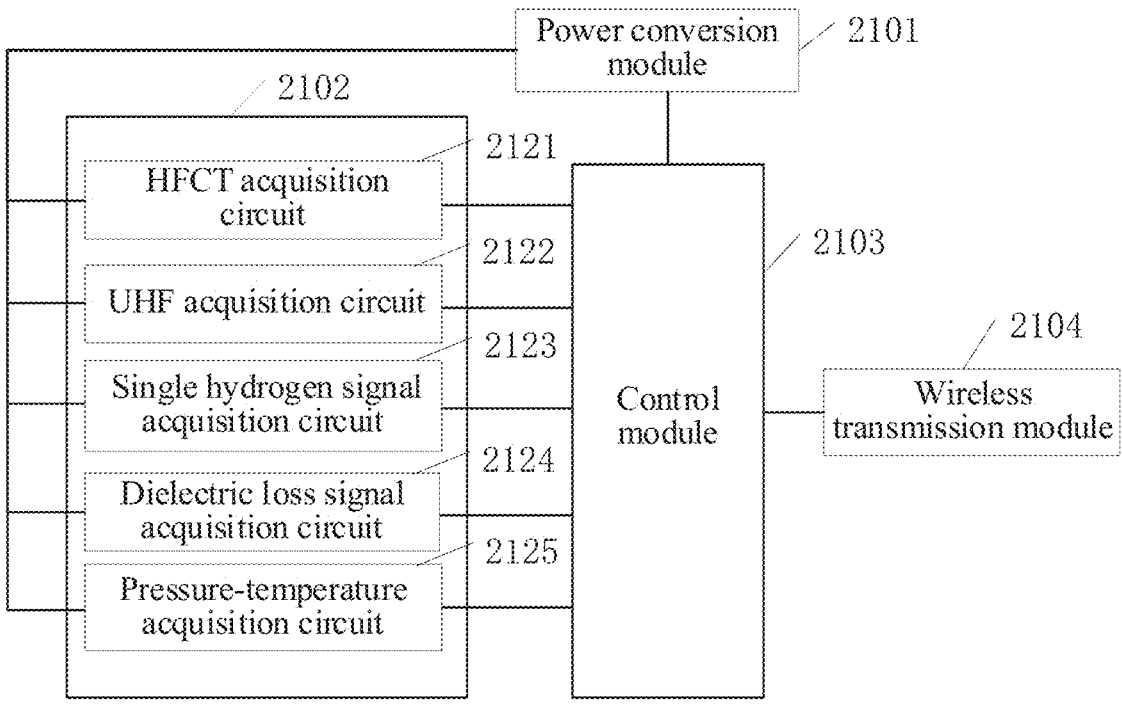
FIG. 12 is a structural view of a second circuit board according to the present disclosure.
Figure 13A:
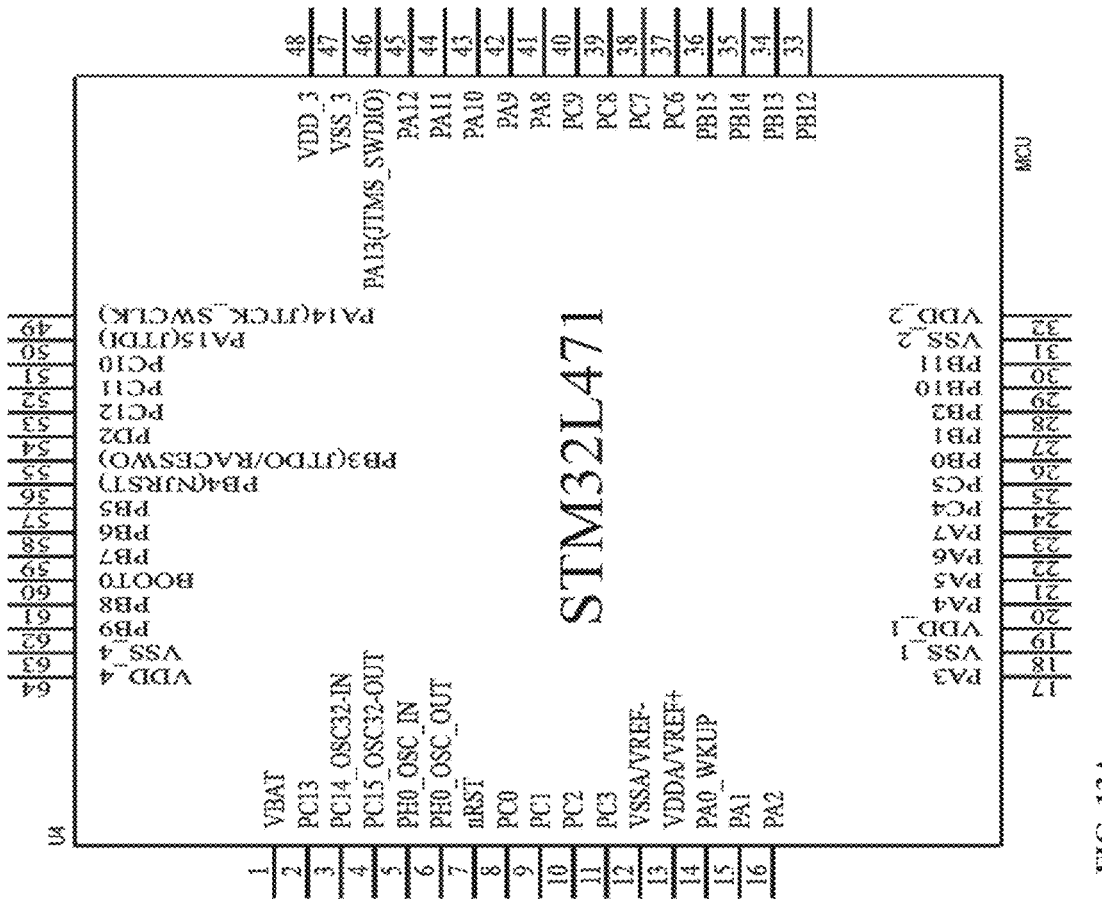
FIG. 13 illustrates a circuit of a control module according to the present disclosure.
Figure 13B:
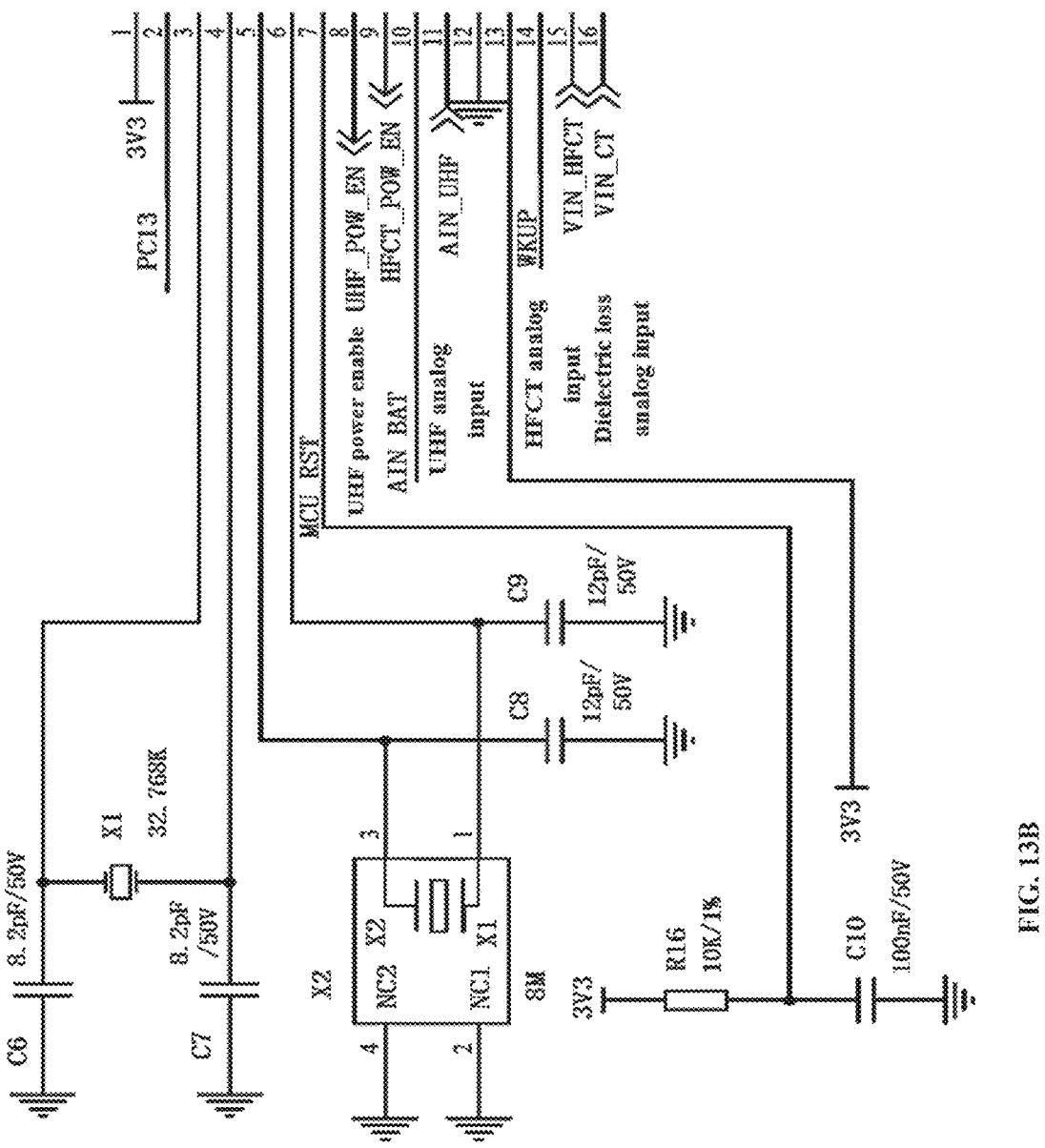
Figure 13C:
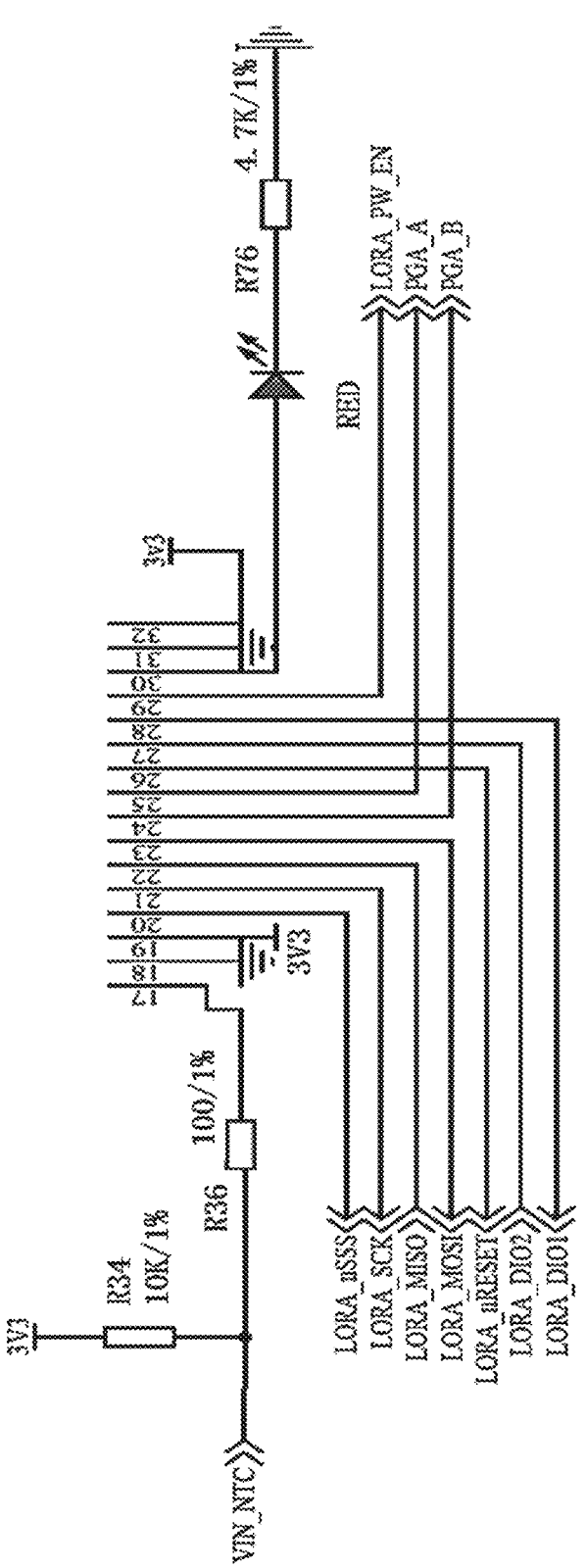
Figure 13D:
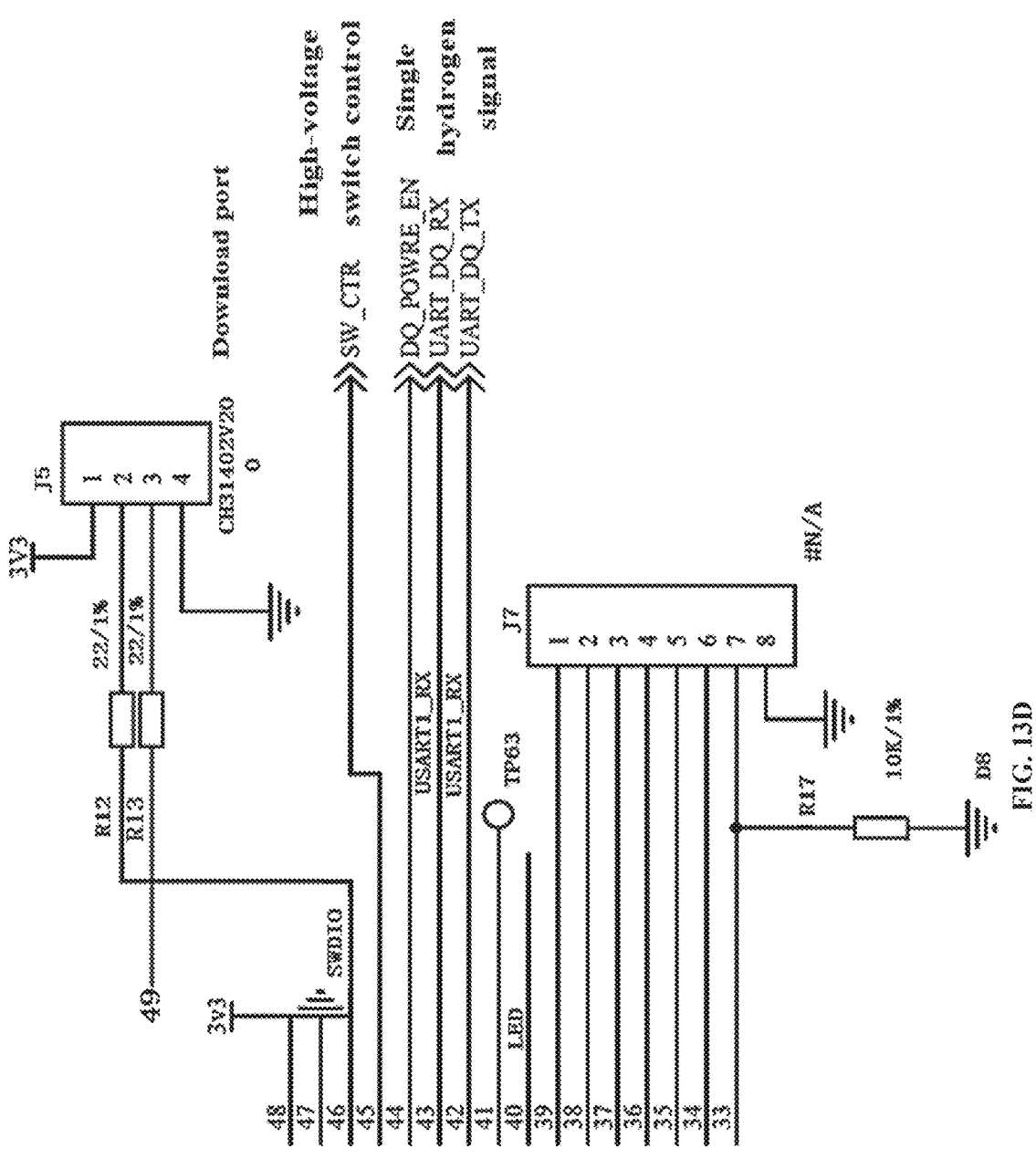
Figure 13E:
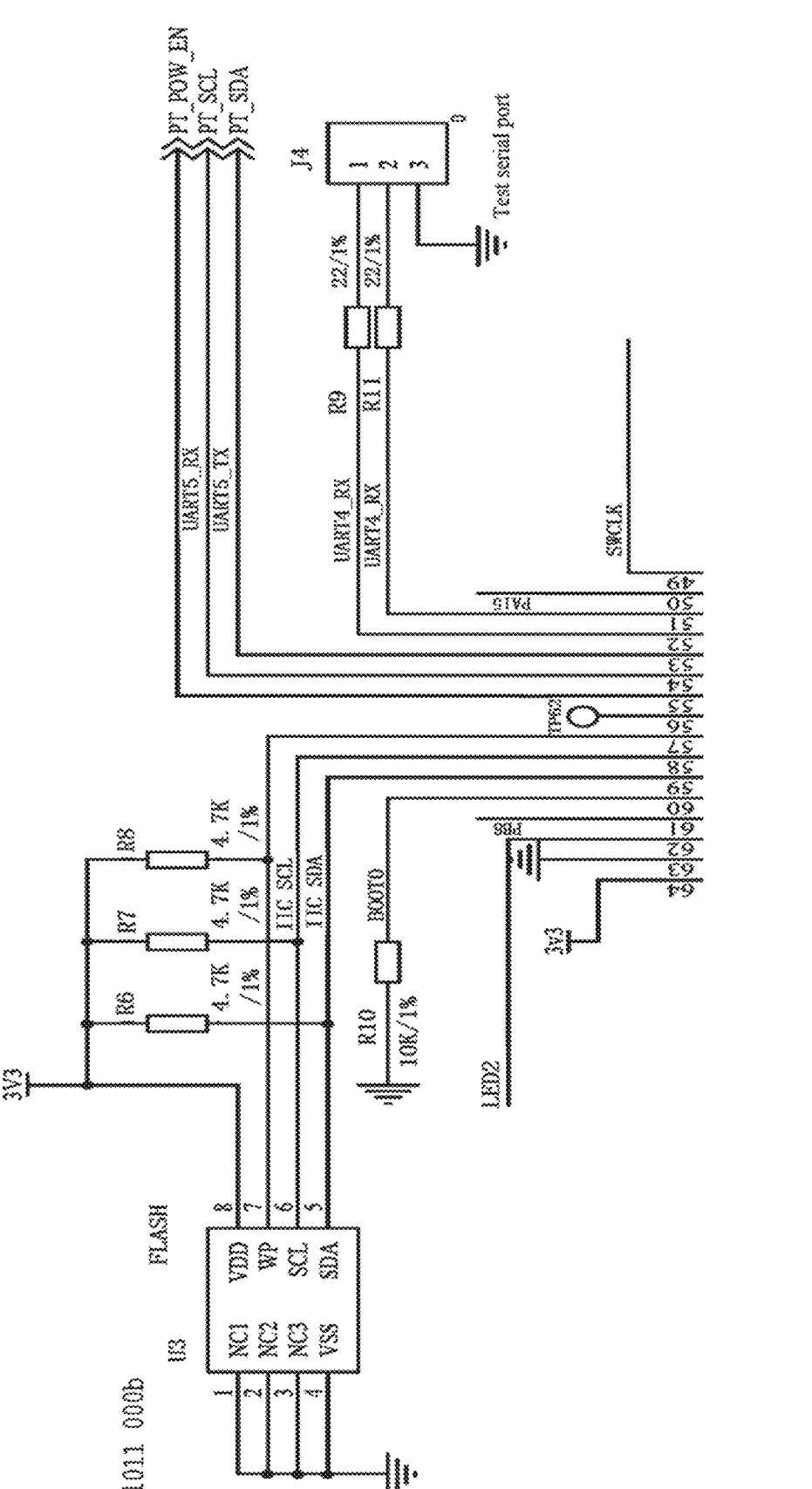
Figure 14A:
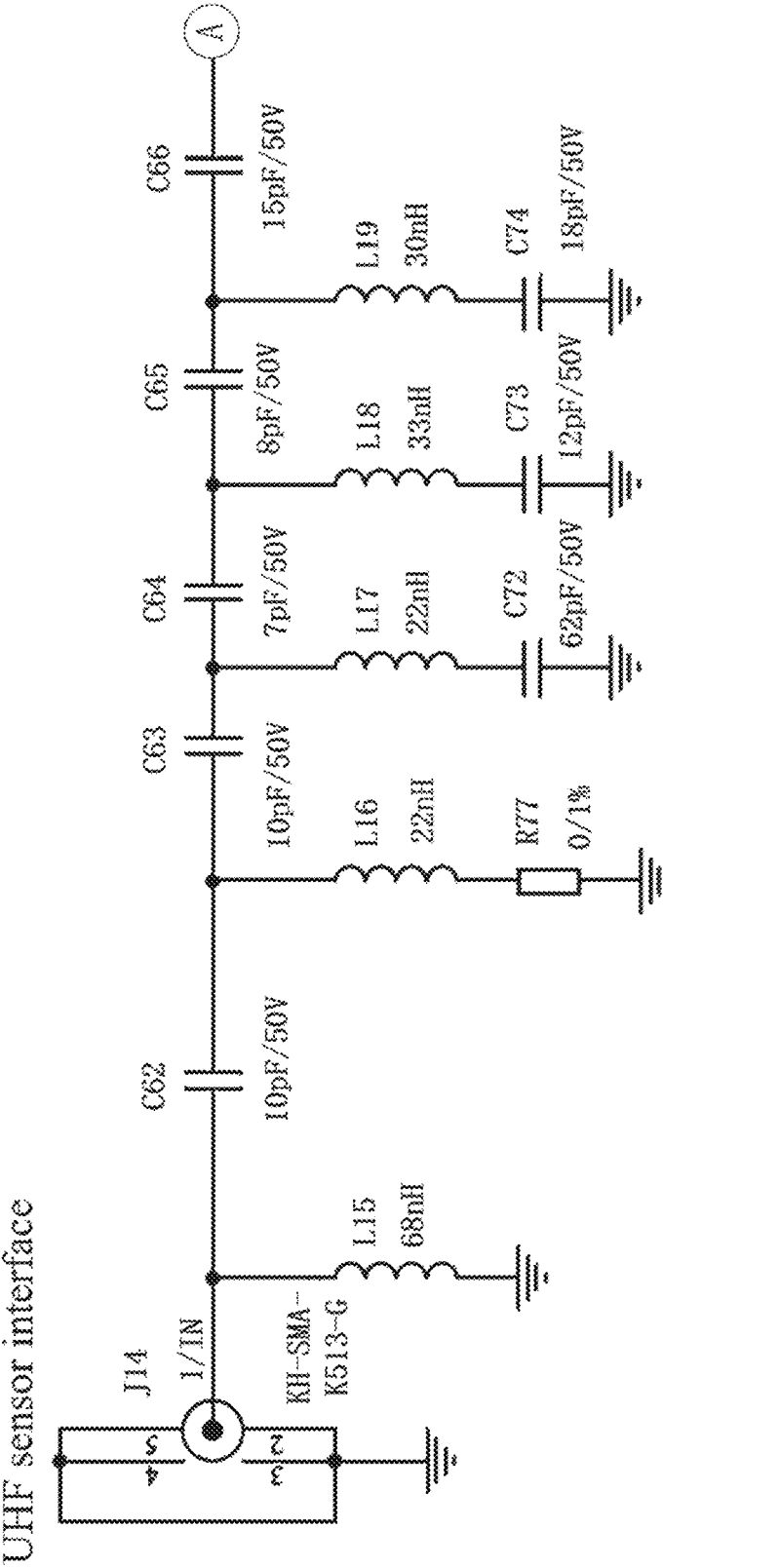
FIG. 14 illustrates a UHF signal acquisition circuit according to the present disclosure.
Figure 14B:
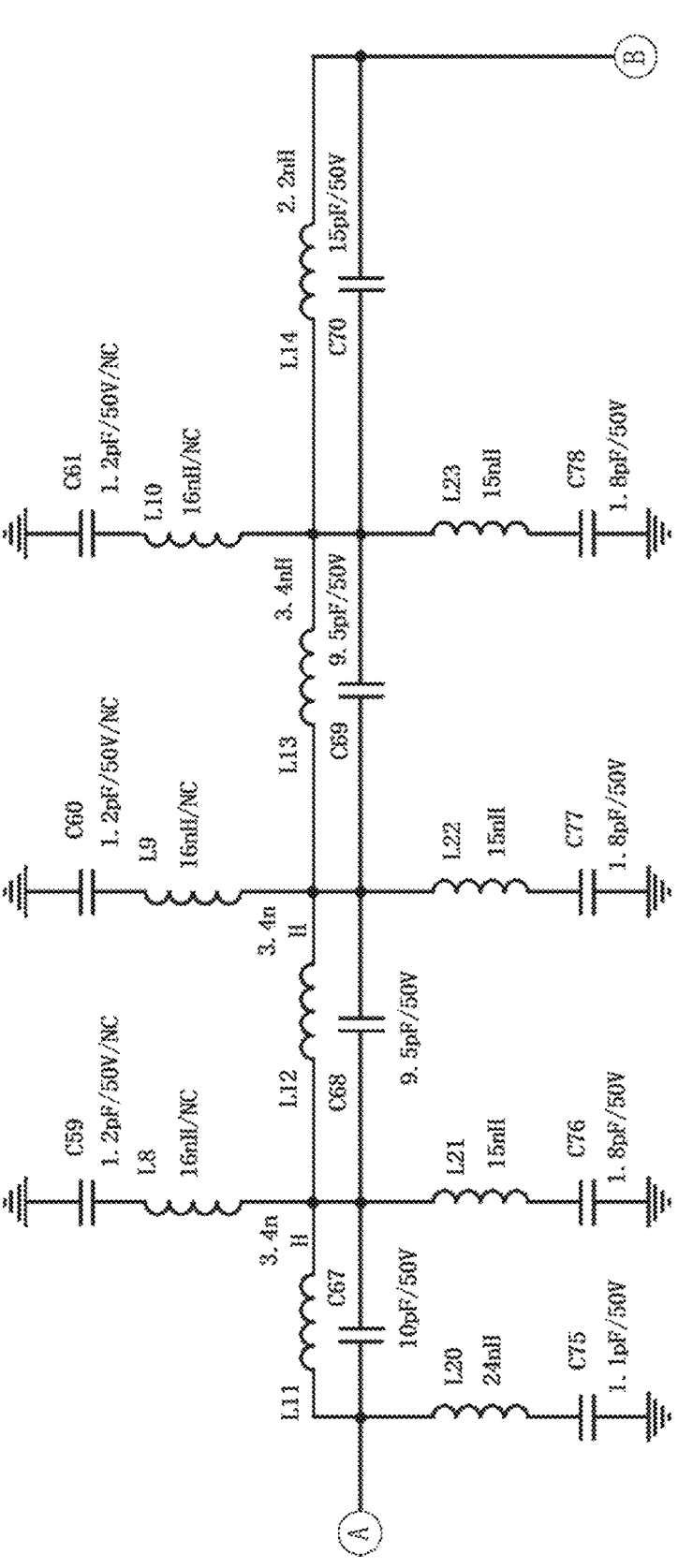
Figure 14C:
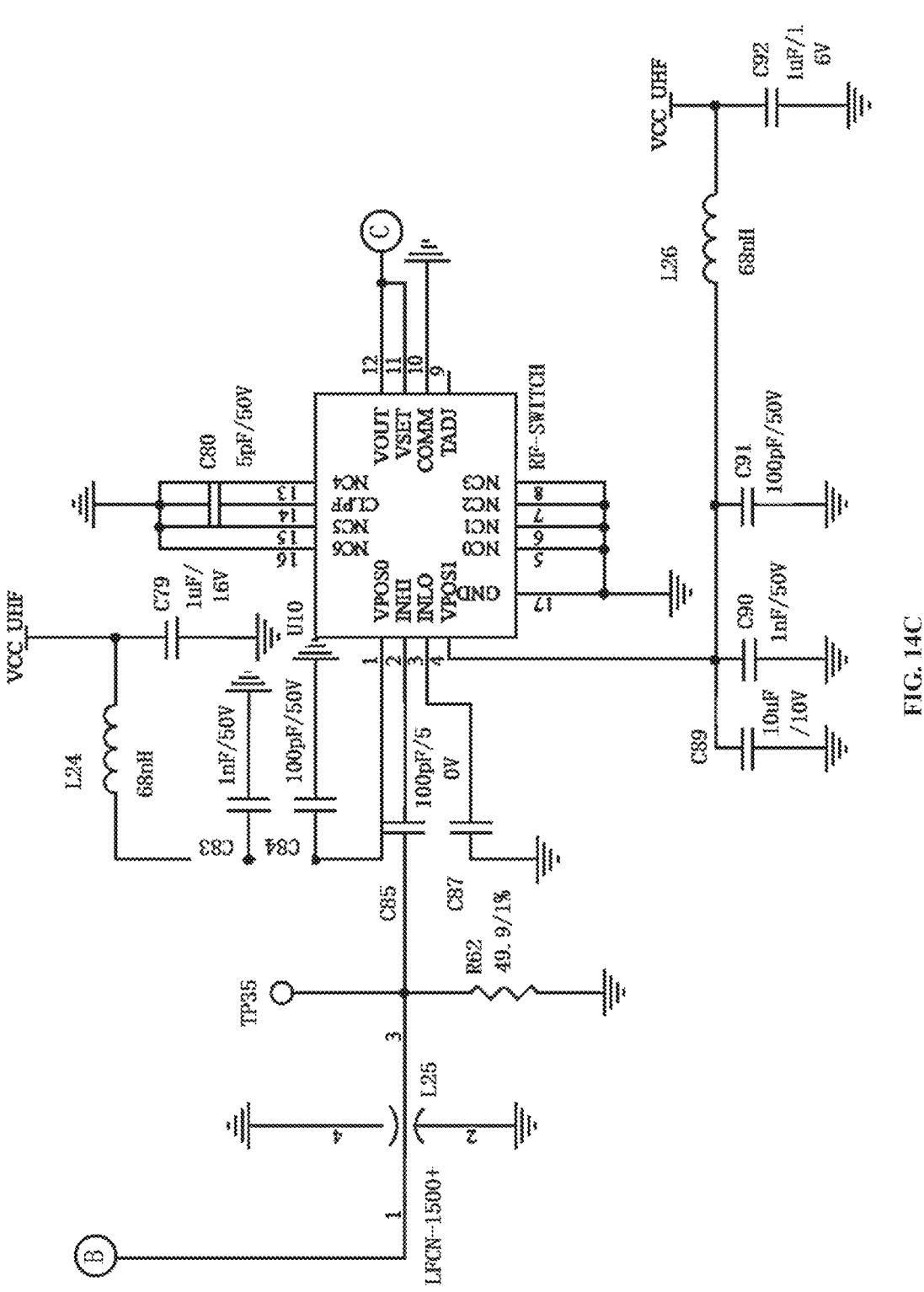
Figure 14D:
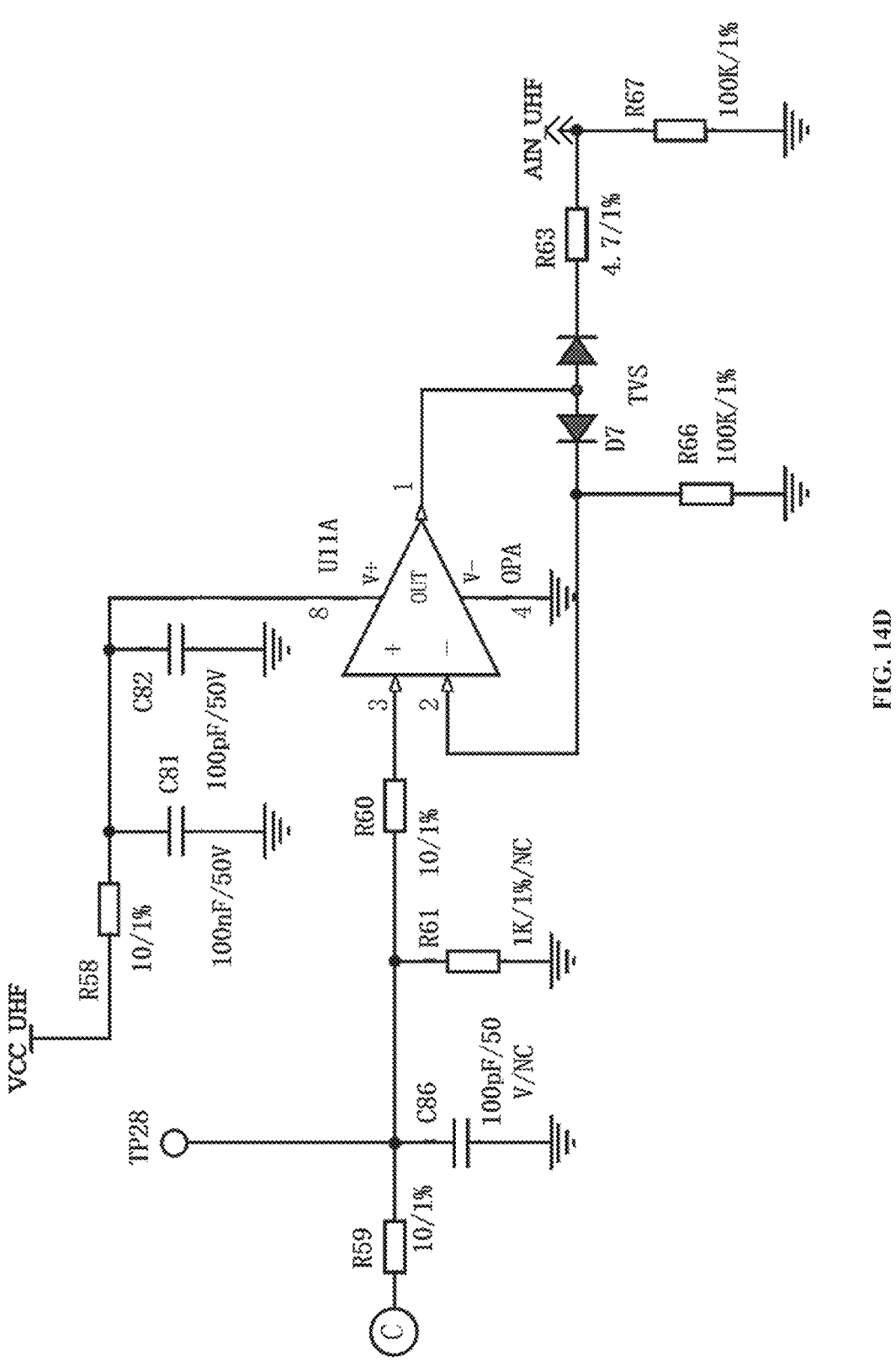
Figure 15A:
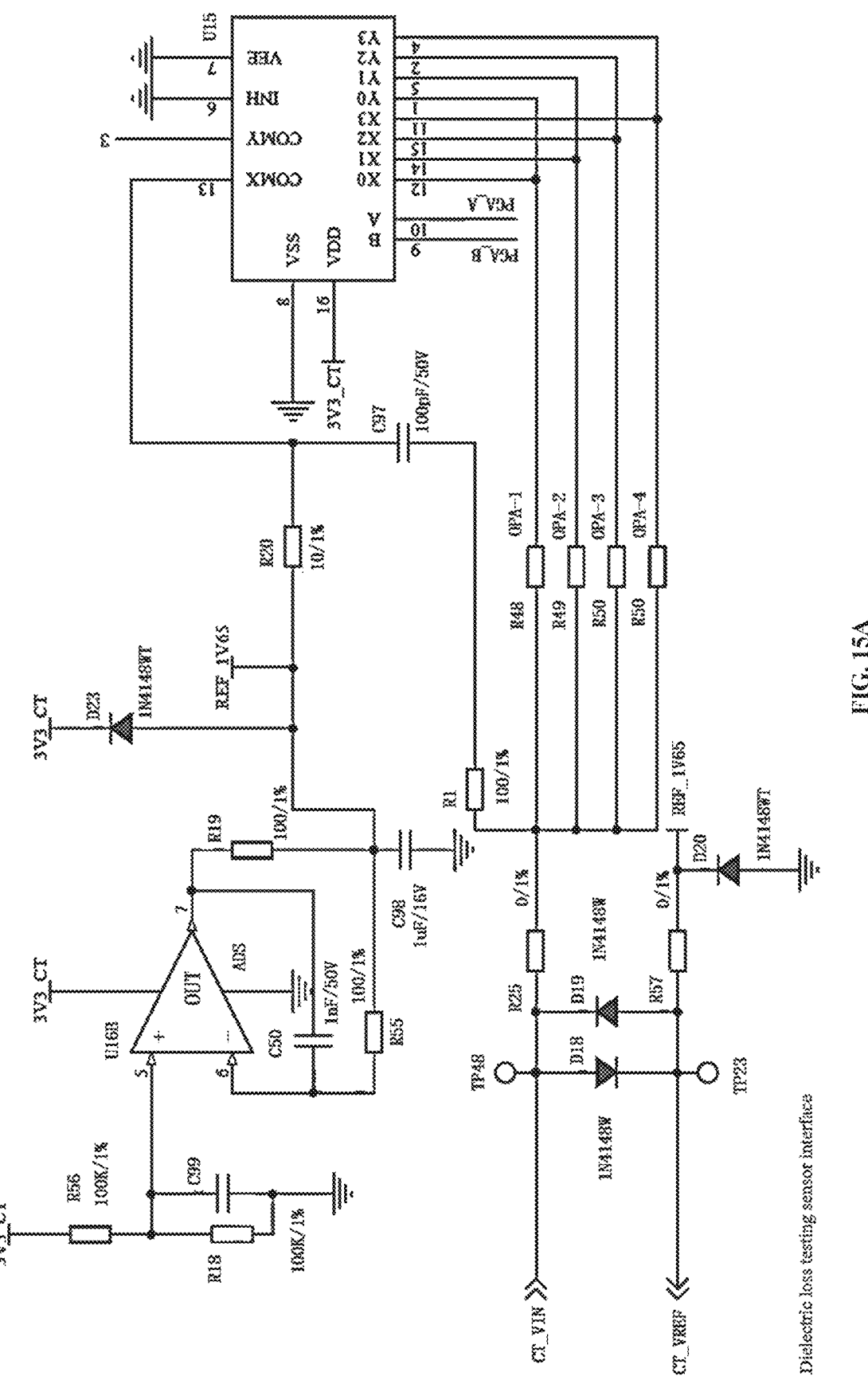
FIG. 15 illustrates a dielectric loss signal acquisition circuit according to the present disclosure.
Figure 15B:
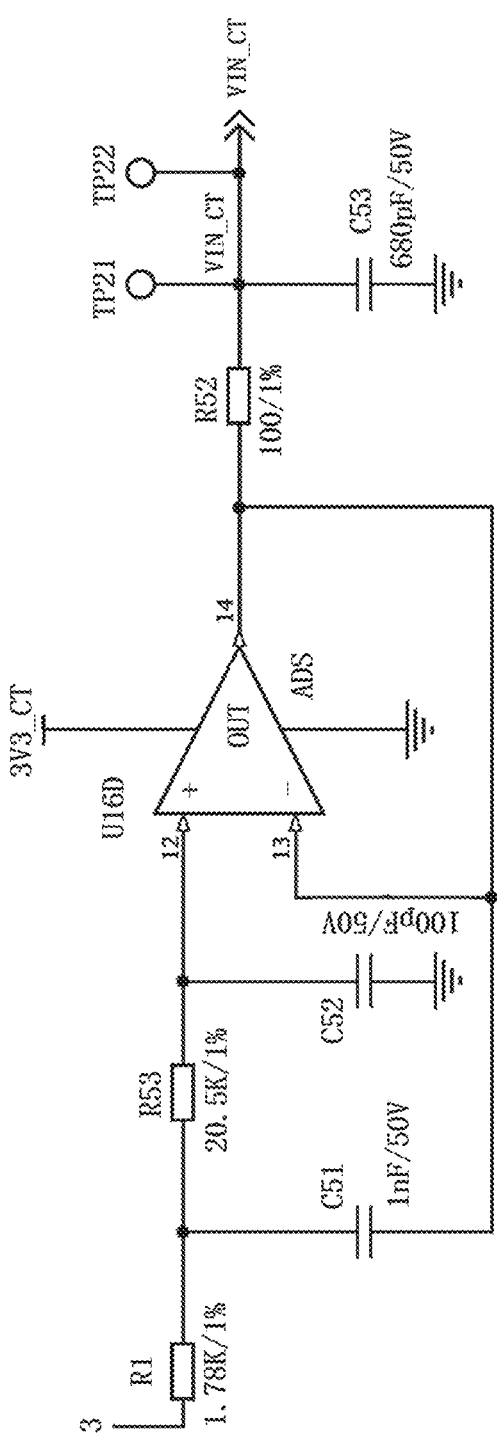
Figure 16A:
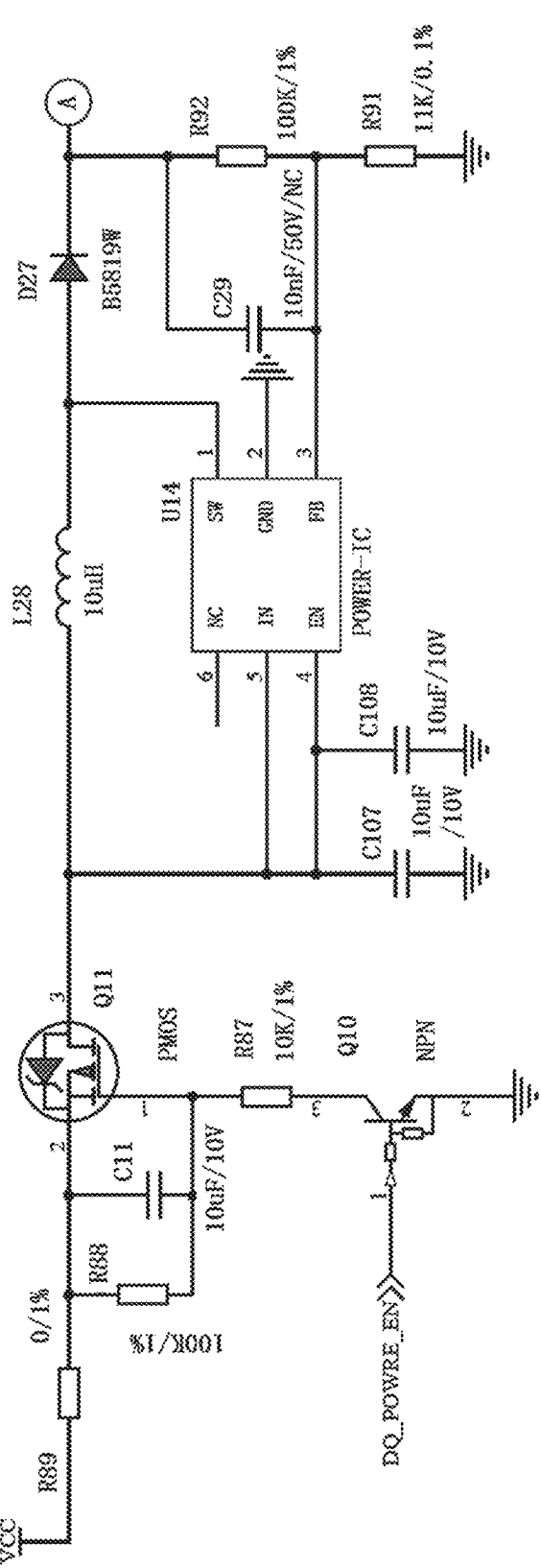
FIG. 16 illustrates a single hydrogen signal acquisition circuit according to the present disclosure.
Figure 16B:
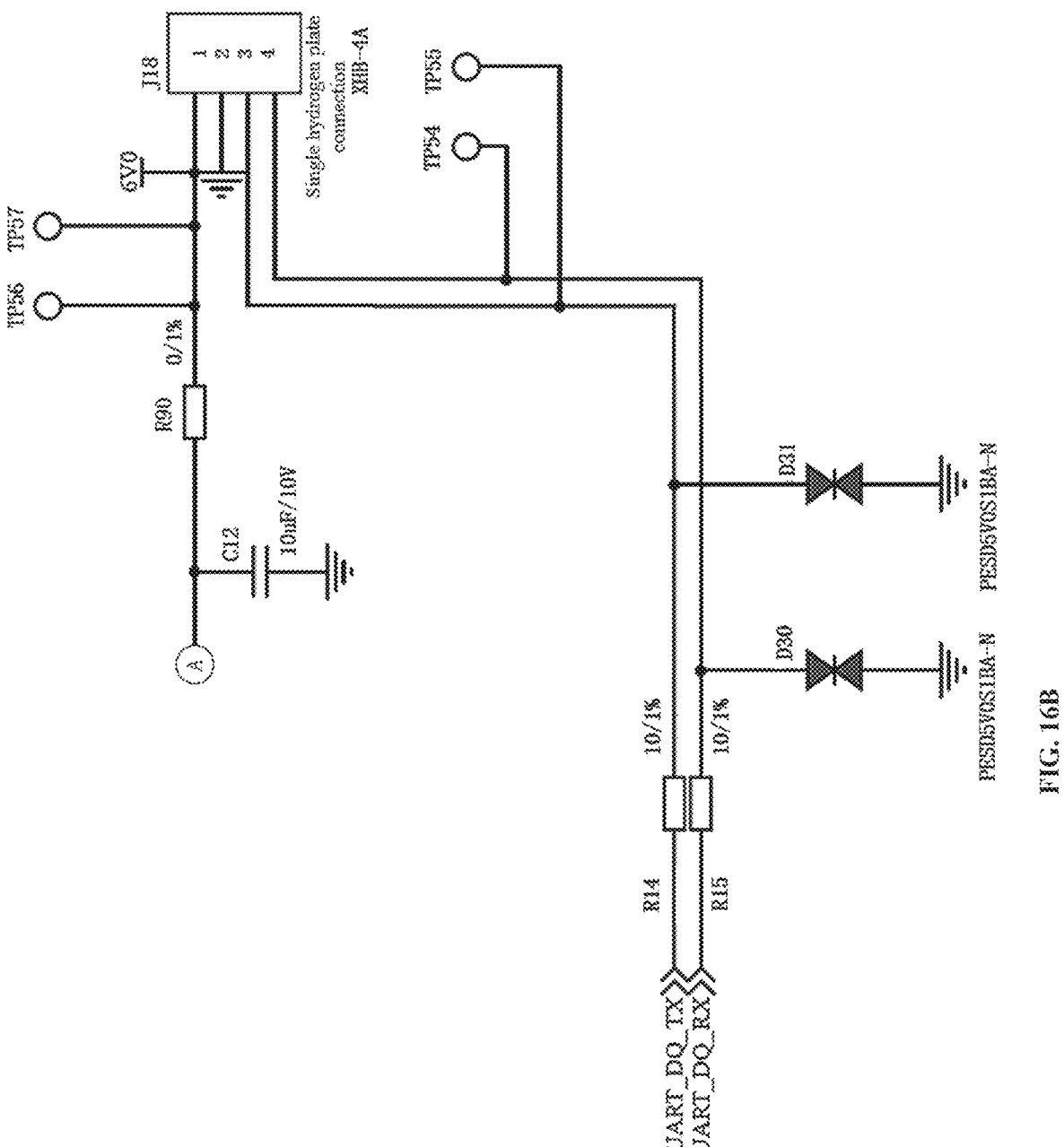
Figure 17A:
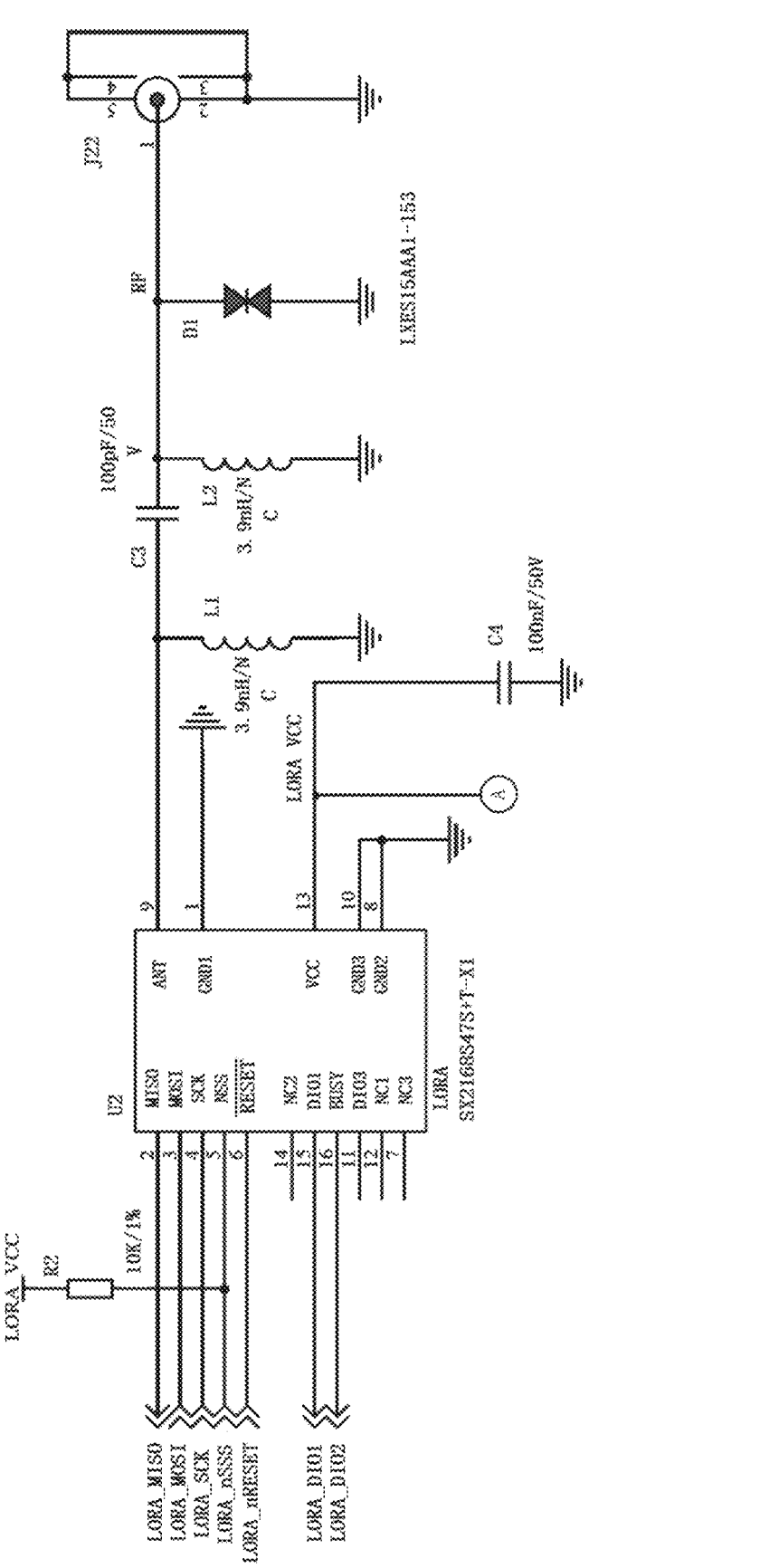
FIG. 17 illustrates a circuit of a LORA antenna according to the present disclosure.
Figure 17B:
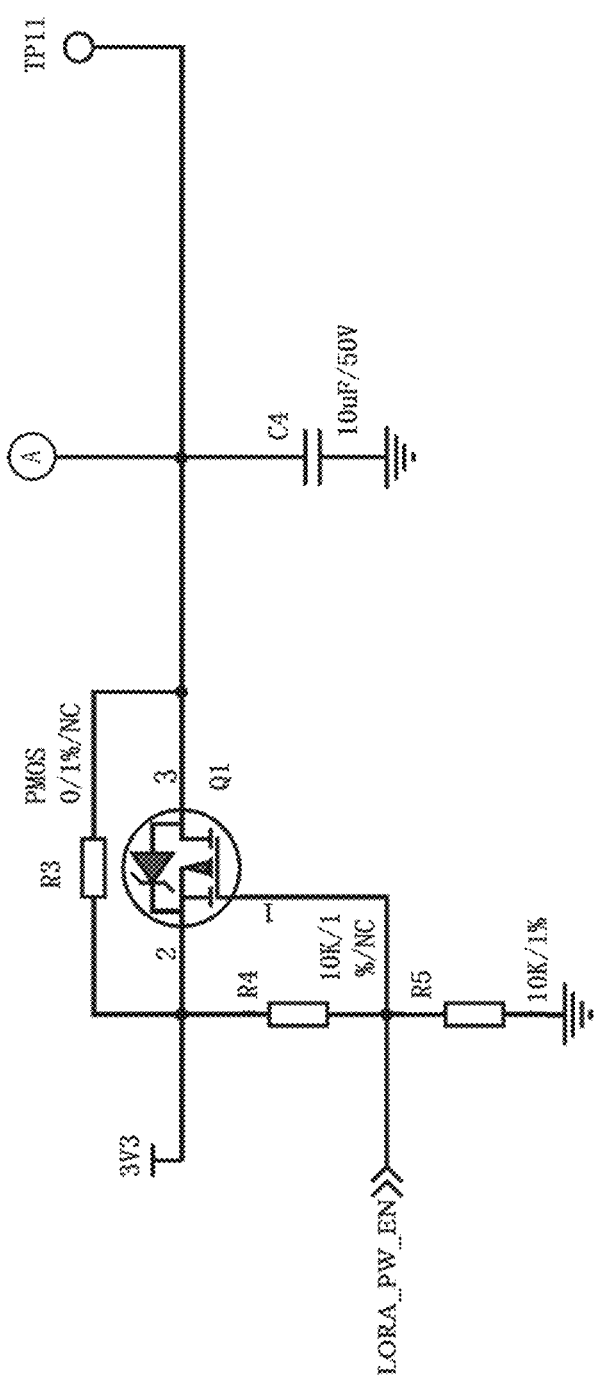
Figure 18A:
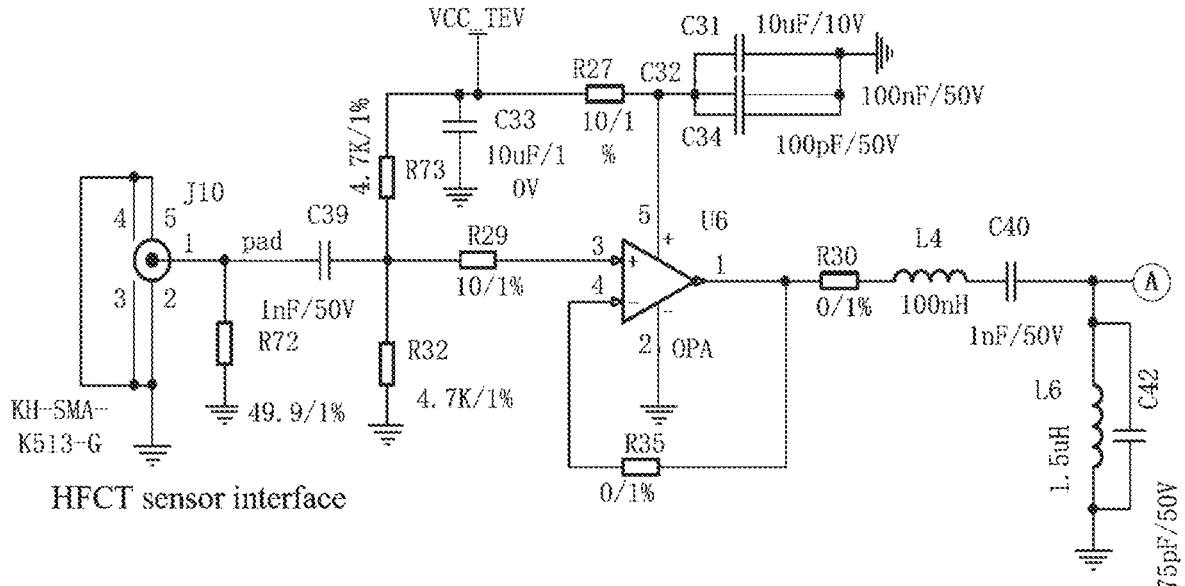
FIG. 18 illustrates an HFCT signal acquisition circuit according to the present disclosure.
Figure 18B:
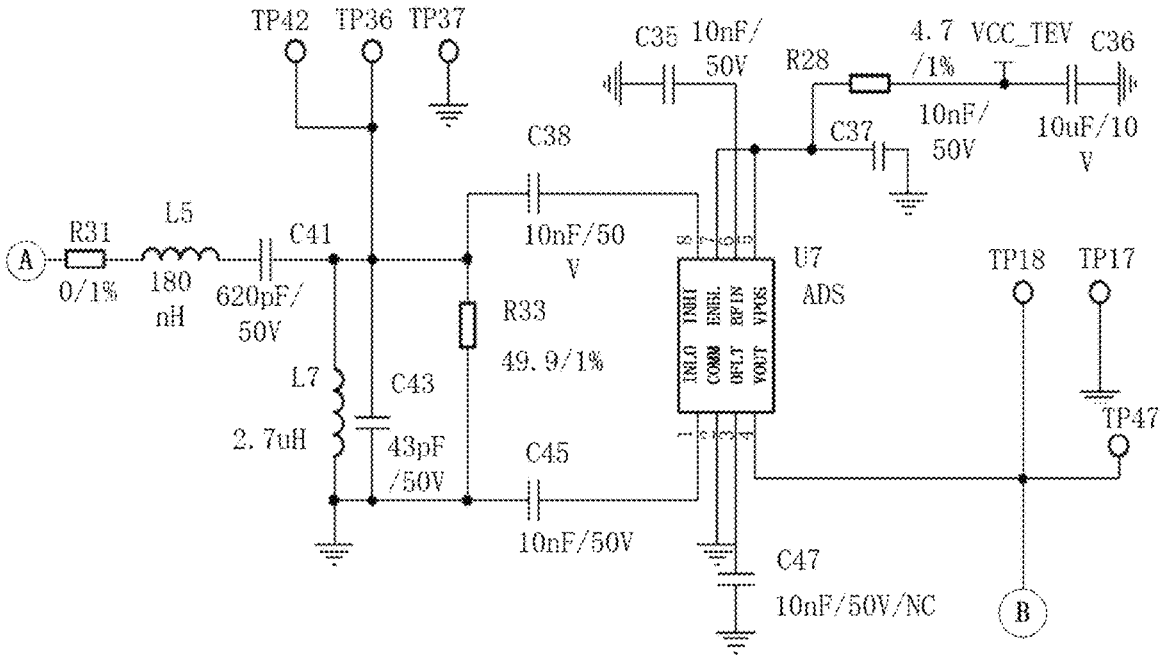
Figure 18C:
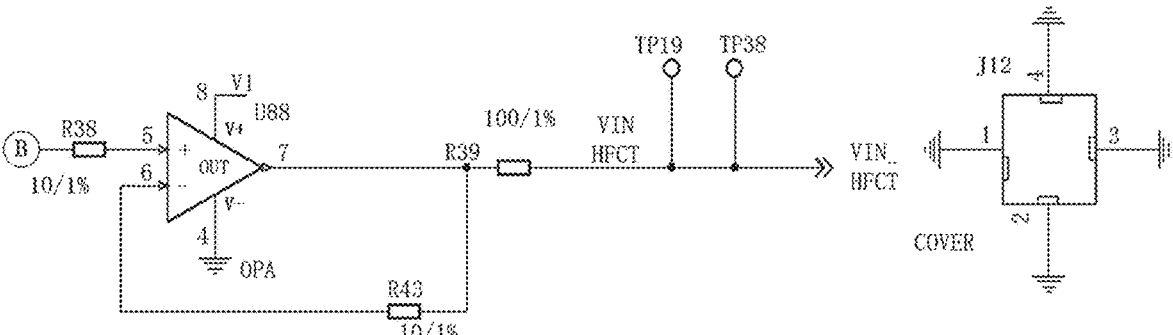
Figure 19:
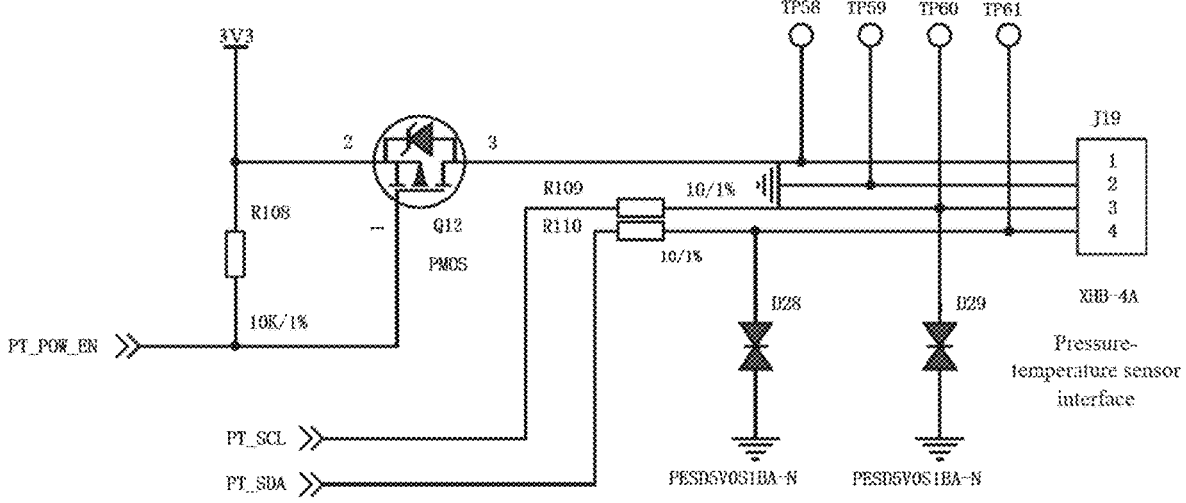
FIG. 19 illustrates a pressure-temperature signal acquisition circuit according to the present disclosure.

Referring to FIG. 12, the second circuit board 210 includes:

a power conversion module 2101, a signal acquisition module 2102, a control module 2103, and a wireless transmission module 2104.

An output terminal of the power conversion module 2101 is connected to the signal acquisition module 2102 and the control module 2103. An output terminal of the signal acquisition module 2102 is connected to the control module 2103. The control module 2103 is connected to the wireless transmission module 2104.

The signal acquisition module 2102 includes an HFCT acquisition circuit 2121, a UHF acquisition circuit 2122, a single hydrogen signal acquisition circuit 2123, a dielectric loss signal acquisition circuit 2124, and a pressure-temperature acquisition circuit 2125.

Specifically, the high-frequency head 205, the pressure sensor 206, the temperature sensor and the hydrogen sensor 208 each include the output terminal connected to the signal acquisition module 2102 of the second circuit board 210. An output terminal of the signal acquisition module 2102 is connected to an input terminal of the control module 2103.

The HFCT acquisition circuit 2121 is configured to acquire an output signal of a coaxial RF cable in the transformer bushing, perform multistage amplification on an acquired output signal and transmit a processed signal to the control module.

The UHF acquisition circuit 2122 is configured to acquire the output signal of the coaxial RF cable in the transformer bushing, input the acquired output signal to an LC filter circuit and an amplifier circuit to obtain a UHF acquisition signal and transmit the UHF acquisition signal to the control module.

The single hydrogen signal acquisition circuit 2123 is configured to amplify a signal detected by the hydrogen sensor, and output an amplified signal to the control module.

The dielectric loss signal acquisition circuit 2124 is configured to compare a signal obtained by signal acquisition of the dielectric loss sensor from a lead-out grounding wire with a preset reference voltage to obtain a dielectric loss signal, and transmit the dielectric loss signal to the control module.

The pressure-temperature acquisition circuit 2125 is configured to transmit a temperature signal and a pressure signal of the transformer bushing respectively detected by the temperature sensor and the pressure sensor to the control module.

Specifically, referring to FIG. 13 to FIG. 19, the control module 2103 is an STM32L471-type MCU. The STM32L471-type MCU is an ultra-low-power 80-Mhz Arm Cortex-M4 MCU having an FPU, and is provided with a 512-KB Flash memory and a DFSDM.

The temperature sensor is Ntc10d-11-type thermistor, and the pressure sensor 206 is a Rv1-10d561k-type varistor. The antenna is an SX1268-type LORA antenna with a transmission frequency of 470-510 MHz.

Figure 20A:
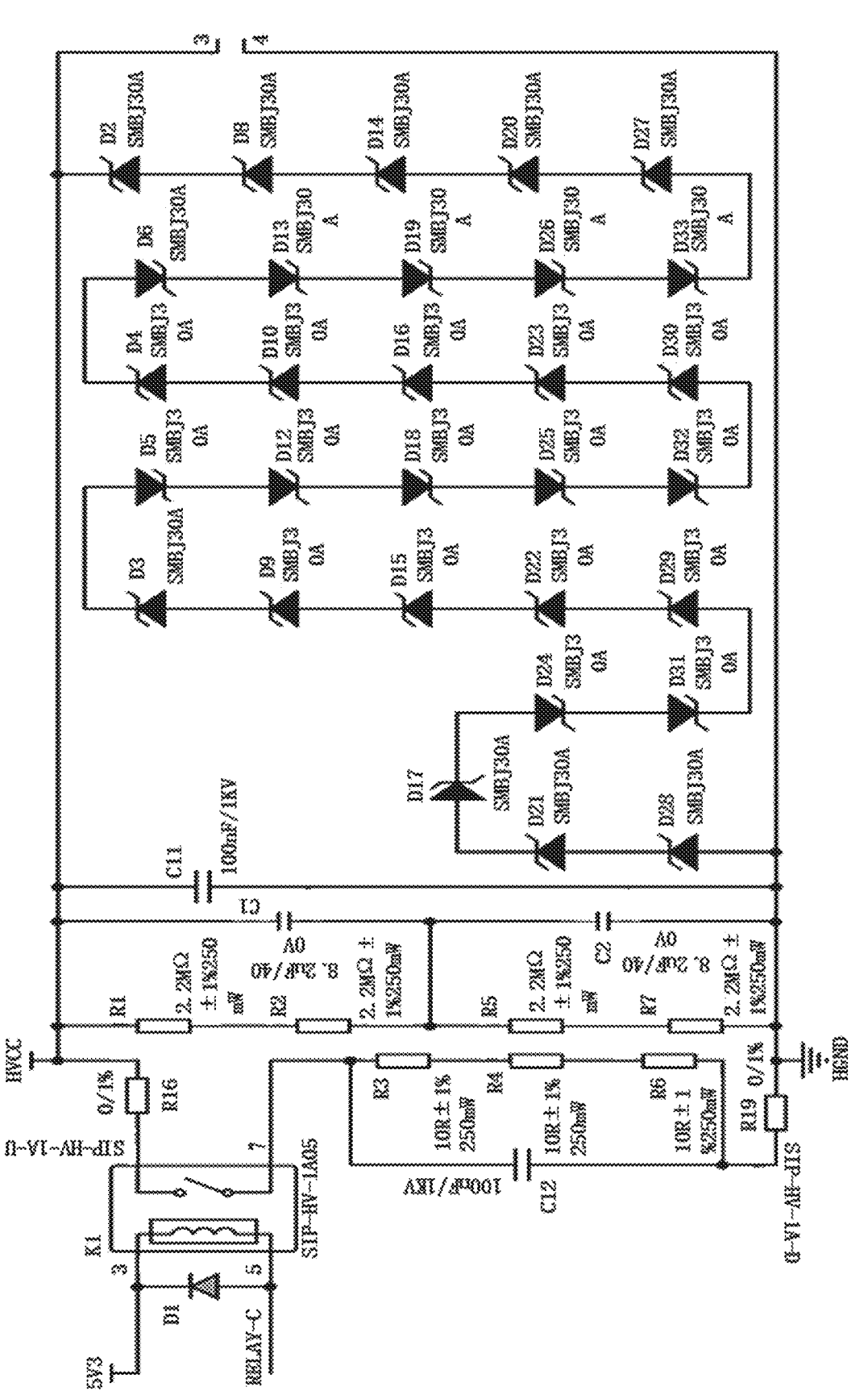
FIG. 20 illustrates a circuit of a power control module according to the present disclosure.
Figure 20B:
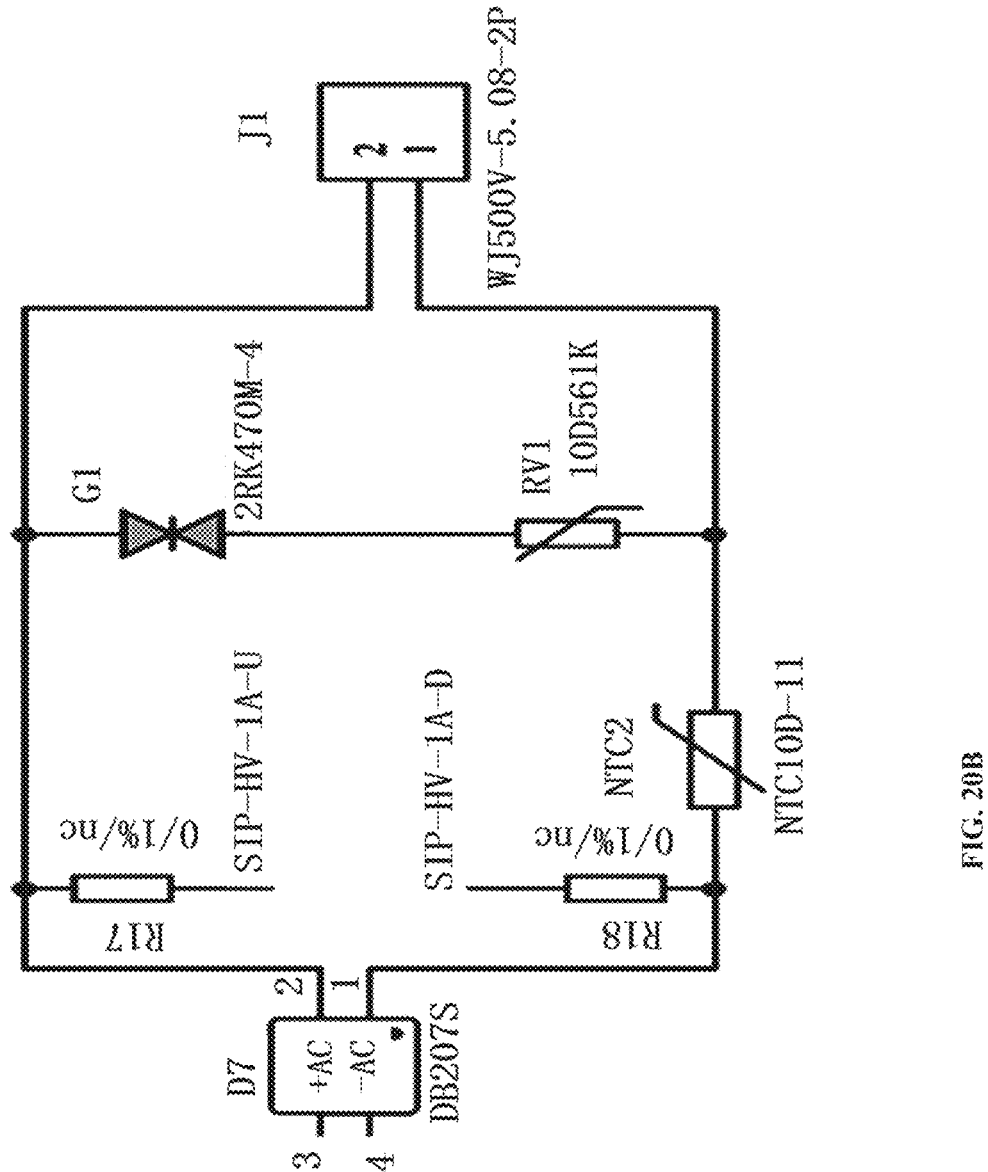
Figure 21:
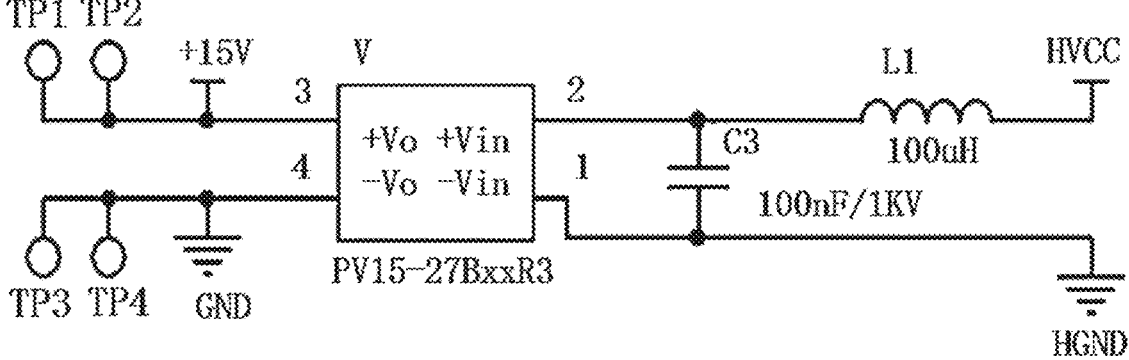
FIG. 21 illustrates a direct-current (DC)-DC converter circuit according to the present disclosure.
Figure 22A:
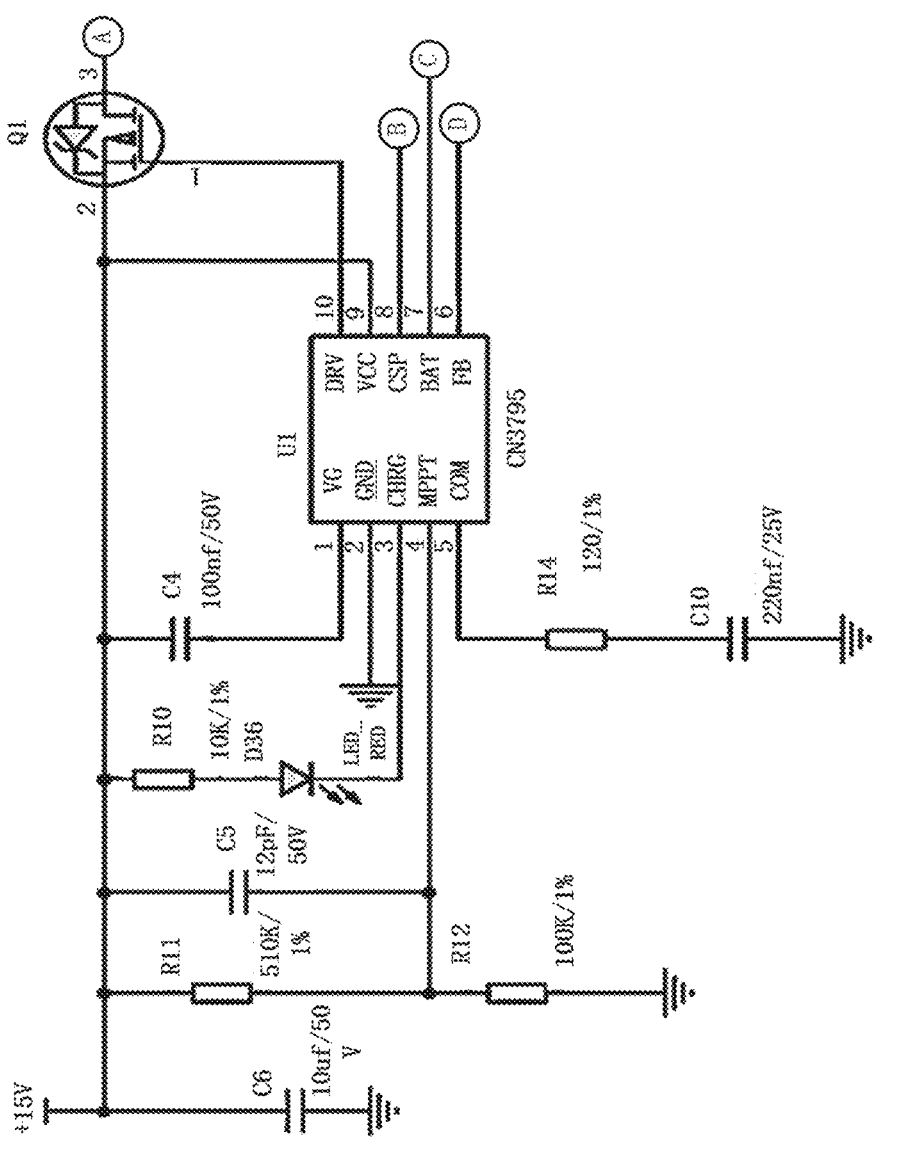
FIG. 22 illustrates a charging-discharging management circuit according to the present disclosure.
Figure 22B:
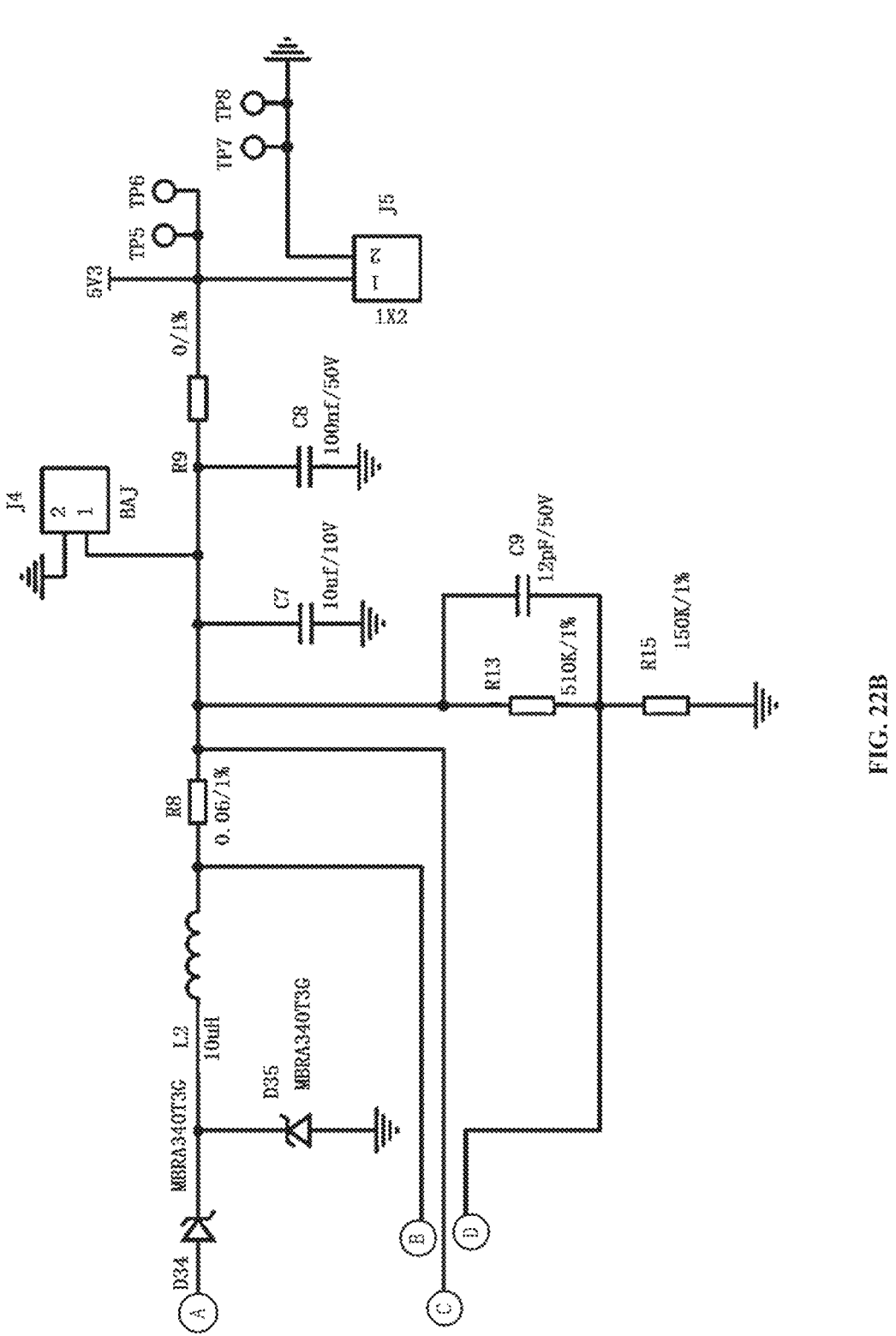

Referring to FIG. 20, in the embodiment of the present disclosure, the power conversion module includes a test switch, a rectifier circuit, a stabilizer circuit, a filter circuit, and a DC-DC converter circuit. The test switch is in parallel connection at an input terminal of the rectifier circuit. An output terminal of the rectifier circuit is connected to the stabilizer circuit. An output terminal of the stabilizer circuit is connected to the filter circuit. An output terminal of the filter circuit is connected to the DC-DC converter circuit. The test switch is a Sip-hv-1a-d-type vacuum circuit breaker. The rectifier circuit uses a DB207S-type rectifier bridge. Referring to FIG. 21, the DC-DC converter circuit uses aPV15-27BxxR3-tpe ultra-wide voltage input DC/DC power module. The power module further includes a charging-discharging management circuit. Referring to FIG. 22, the charging-discharging management circuit uses a CN3795-type lithium-ion battery charging management chip.

In the embodiments of the present disclosure, the wireless transmission module may be one or more processors, controllers or chips that each have a communication interface and can realize a communication protocol, and may further include a memory, a related interface and a system transmission bus, and the like if necessary. The processor, the controller or the chip executes a program-related code to realize a corresponding function.

The specific implementations of the present disclosure have been described in detail above, but the present disclosure is not limited to the foregoing implementations. Various changes can be made without departing from the tenet of the present disclosure within the range of knowledge possessed by those of ordinary skill in the art. Many other changes and modifications can be made without departing from the concept and scope of the present disclosure. It is to be understood that the present disclosure is not limited to specific implementations, and the scope of the present disclosure is defined by the appended claims.

The invention claimed is:

1. An all-in-one sensing apparatus for transformer bushing tap monitoring, comprising:
   a tap lead device that is connected to a grounding wire of a transformer bushing through a mounting bracket and is configured to lead out the grounding wire to facilitate detection of current and voltage signals of the grounding wire;
   a sensor assembly that is provided on the mounting bracket and connected to an oil taking port of the transformer bushing, and is configured to detect a temperature, a pressure, a partial discharge current and a hydrogen content of the transformer bushing and to upload the temperature, the pressure, the partial discharge current and the hydrogen content of the transformer bushing; and
   a power module that is provided on the mounting bracket and is configured to supply power to the sensor assembly through coil induction,
   wherein an output terminal of the tap lead device is connected to the power module, and an output terminal of the power module is connected to the sensor assembly;
   the sensor assembly comprises: a base, a mounting housing, and a cover body,
   wherein the mounting housing is provided on the base; the cover body covers the mounting housing; the base is connected to the transformer bushing through the mounting bracket with a flange plate; and a high-frequency probe, a pressure sensor, a temperature sensor and a hydrogen sensor are provided in the base;

a first circuit board and a second circuit board are provided in the mounting housing;
an exhaust vent and an oil taking port are formed at a side of the base;
an antenna is provided at a side of the mounting housing; and the antenna is connected to the second circuit board;
a first wiring port and a second wiring port are further formed at the side of the mounting housing;
the first wiring port is connected to the first circuit board, and the second wiring port is connected to the second circuit board; and
the high-frequency probe, the pressure sensor, the temperature sensor and the hydrogen sensor each comprises an output terminal connected to the second circuit board; and an output terminal of the first circuit board is connected to the high-frequency probe, the pressure sensor, the temperature sensor and the hydrogen sensor; and
the second circuit board comprises:
a power conversion module, a signal acquisition module, a control module, and a wireless transmission module,
wherein an output terminal of the power conversion module is connected to the signal acquisition module and the control module; an output terminal of the signal acquisition module is connected to the control module; and the control module is connected to the wireless transmission module;
the signal acquisition module comprises a high frequency current transformer (HFCT) acquisition circuit, an ultra high frequency (UHF) acquisition circuit, a single hydrogen signal acquisition circuit, a dielectric loss signal acquisition circuit, and a pressure-temperature acquisition circuit;
the HFCT acquisition circuit is configured to acquire an output signal of a coaxial radio-frequency (RF) cable in the transformer bushing, to perform multistage amplification on an acquired output signal, and to transmit a processed signal to the control module;
the UHF acquisition circuit is configured to acquire the output signal of the coaxial RF cable in the transformer bushing, to input the acquired output signal to an inductor-capacitor (LC) filter circuit and an amplifier circuit to obtain a UHF acquisition signal, and to transmit the UHF acquisition signal to the control module;
the single hydrogen signal acquisition circuit is configured to amplify a signal detected by the hydrogen sensor, and to output an amplified signal to the control module;
the dielectric loss signal acquisition circuit is configured to compare a signal obtained by signal acquisition of a dielectric loss sensor from a lead-out grounding wire with a preset reference voltage to obtain a dielectric loss signal, and to transmit the dielectric loss signal to the control module; and
the pressure-temperature acquisition circuit is configured to transmit a temperature signal and a pressure signal of the transformer bushing respectively detected by the temperature sensor and the pressure sensor to the control module.

2. The all-in-one sensing apparatus for transformer bushing tap monitoring according to claim 1, wherein the power module comprises a housing; a rechargeable battery, a power control module, a power supply coil and a detection coil are provided in the housing; an output terminal of the detection coil is connected to the first circuit board through the first wiring port; an output terminal of the power supply coil is connected to the power control module; the power control module is connected to the rechargeable battery; and an output terminal of the power control module is connected to the second circuit board through the second wiring port.

3. The all-in-one sensing apparatus for transformer bushing tap monitoring according to claim 1, wherein the tap lead device comprises a tap housing and a rear cover connected to the tap housing; an insulating sleeve is provided in the tap housing; a compression ring and a pressure spring are provided in the insulating sleeve; a conductive post is provided in the pressure spring; and a wire outgoing hole is formed in the rear cover.

4. The all-in-one sensing apparatus for transformer bushing tap monitoring according to claim 3, wherein a junction between the tap housing and the transformer bushing is provided with a sealing groove; and a sealing ring is provided in the sealing groove.

5. The all-in-one sensing apparatus for transformer bushing tap monitoring according to claim 1, wherein the mounting bracket comprises a bottom plate, a bushing mounting plate, and a support plate; the bottom plate and the bushing mounting plate are parallel to each other and are connected through a connecting plate; the support plate is further provided between the bottom plate and the bushing mounting plate; a wire hole is formed in the support plate; a bushing tap grounding wire hole and an oil taking port are formed in the connecting plate; the sensor assembly is provided at the oil taking port of the connecting plate; the tap lead device is provided at the bushing tap grounding wire hole; and the sensor assembly, the tap lead device and the power module are connected to the mounting bracket.

6. The all-in-one sensing apparatus for transformer bushing tap monitoring according to claim 1, wherein the control module is a microprocessor control unit (MCU).

7. The all-in-one sensing apparatus for transformer bushing tap monitoring according to claim 1, wherein the temperature sensor is a thermistor, and the pressure sensor is a varistor.

8. The all-in-one sensing apparatus for transformer bushing tap monitoring according to claim 1, wherein the antenna is a long-range (LORA) antenna with a transmission frequency of 470-510 MHz.

* * * * *